United States Patent [19]

Shoji et al.

[11] Patent Number: 5,097,446
[45] Date of Patent: Mar. 17, 1992

[54] NONVOLATILE SEMICONDUCTOR MEMORY DEVICE

[75] Inventors: Kazuyoshi Shoji, Akishima; Takaaki Hagiwara, Hinode; Tadashi Muto, Iruma; Shun-ichi Saeki, Higashimurayama; Yasurou Kubota, Akishima; Kazuto Izawa, Musashino; Yoshiaki Kamigaki, Tokorozawa; Shin-ichi Minami, Kodaira; Yuko Nabetani, Hinode, all of Japan

[73] Assignees: Hitachi, Ltd.; Hitachi VLSI Engineering Corp., both of Tokyo, Japan

[21] Appl. No.: 355,480

[22] Filed: May 23, 1989

[30] Foreign Application Priority Data

May 23, 1988 [JP] Japan .................. 63-125468
Jun. 20, 1988 [JP] Japan .................. 63-151658

[51] Int. Cl.$^5$ .............................. G11C 11/40
[52] U.S. Cl. .................. 365/195; 365/185; 365/218
[58] Field of Search .......... 365/185, 189.01, 195, 365/218

[56] References Cited

U.S. PATENT DOCUMENTS 4,279,024  7/1981  Schrenk .................. 365/218
4,908,795  3/1990  Tsuchiya et al. ......... 365/189.01

FOREIGN PATENT DOCUMENTS 55-8697    1/1980  Japan .
59-191196 10/1984  Japan .
62-8397    1/1987  Japan .
62-146496  6/1987  Japan .
62-223897 10/1987  Japan .
62-236199 10/1987  Japan .
62-298096 12/1987  Japan .

*Primary Examiner*—Joseph A. Popek
*Attorney, Agent, or Firm*—Antonelli, Terry, Stout & Kraus

[57] ABSTRACT

A time circuit is provided for a nonvolatile memory device which can electrically be written into. When the write operation on a particular memory cell lasting a relatively long period of time is specified from an external device, the memory device stops the write operation on that memory cell, irrespective of the external write operaiton specification, when the time set on the timer circuit has elapsed. The nonvolatile memory device has memory cells, each consisting of a single transistor. The erase operation on the memory cells is controlled according to a current flowing through these memory cells.

18 Claims, 10 Drawing Sheets

ROW ADDRESS DECODER R-DEC

NONVOLATILE SEMICONDUCTOR MEMORY DEVICE

BACKGROUND OF THE INVENTION

This invention relates to a nonvolatile semiconductor memory device (also referred to as a nonvolatile memory) and more particularly to a technique which can effectively be applied to a nonvolatile memory that can electrically be written into or those that can electrically be written into and erased from, such as an EPROM (erasable & programmable read-only memory) or an EEPROM (electrically erasable & programmable read-only memory).

An EPROM in which information is electrically written and retained, and in which information is erased by exposing the memory to ultraviolet radiation, is described in the "Hitachi IC Memory Data Book" page 465 to 527, published by Hitachi, Ltd. on March 1987.

In the above-mentioned EPROM, writing information into a memory cell requires application of an adequate voltage for a specified duration to obtain a desired performance that meets the standard requirements. Excessive writing will lead to deterioration of memory cell characteristics.

Writing information into the EPROM is done by using an external EPROM writer. To store specified information in memory cells, the EPROM writer selects a desired memory cell from among a plurality of memory cells forming the EPROM, and applies the specified information to the selected memory cell. The duration in which the specified information is applied to the selected memory cell, i.e., the time during which the information is written (write time) is determined by the EPROM writer. When a write voltage or write time in excess of the standard range is set in the EPROM writer by ignorance or negligence on the part of a user, the memory cell in the nonvolatile memory is applied with an excess charge, resulting in deterioration in the memory cell characteristic. Our examination on the faulty EPROMs returned from the market found that many failed EPROMs were traced to the application of excess charges as the cause of failure.

Memory cells used to form an EEPROM, which can be electrically written and erased, include FLOTOX (floating gate tunnel oxide) type nonvolatile memory cells or MNOS (metal nitride oxide semiconductor) type nonvolatile memory cells. In such nonvolatile memory cells, the address selection switch MOSFET (insulated-gate type field-effect transistor) is connected in series with the memory cell because the threshold voltage is made negative (depletion mode) by an electrical erasure operation.

These FLOTOX and MNOS type memory cells are described in the "Microcomputer Handbook," page 266-267, published by Ohm Co. on Dec. 25, 1985.

SUMMARY OF THE INVENTION

As described above, the EPROM has its nonvolatile memory cells connected with address selection switch MOSFETs. This increases the area occupied by the memory cells, making it difficult to increase the memory capacity.

The inventor of this invention has studied the manufacture of an EEPROM in which each memory cell is formed, like an EPROM, of a single nonvolatile memory element whose information can be erased by exposure to ultraviolet radiation. In this case, for the information to be read from a desired memory cell in the EEPROM a control is necessary to keep the threshold voltage of the nonvolatile memory element during erasure from becoming negative.

The object of this invention is to provide a nonvolatile semiconductor memory device whose cell characteristic is prevented from being deteriorated by excess writing and erasing.

Another object of the invention is to provide an EPROM in which the write operation can easily be performed.

A further object of the invention is to provide a nonvolatile semiconductor memory device in which information can electrically be erased and which has an increased memory capacity A still further object of the invention is to provide an EEPROM which can be increased in memory capacity.

Still another object of the invention is to provide an EEPROM which can easily be handled These and other objects and novel features of this invention will become apparent from the following description of this specification taken in conjunction with the accompanying drawings A representative configuration of the invention disclosed in this specification may be briefly outlined as follows. The nonvolatile memory according to this invention has memory cells each provided with a control gate and a floating gate Information is written into the memory cell by injecting electric charge into the floating gate. The information thus written can be erased by electrically discharging the stored charge from the floating gate. The nonvolatile memory is provided with a timer circuit, which limits to the time settings in the timer circuit the time during which the writing operation is performed and also the time during which the erasure operation is done. This limits the write operation and/or the use operation times to the preset values in the timer circuit which is built into the nonvolatile memory irrespective of control signals supplied from the outside of the nonvolatile memory. Therefore, even when an excessive writing or excessive erasing is specified from outside, the nonvolatile memory cells are protected against possible deterioration in cell characteristics.

In the nonvolatile memory which consists of nonvolatile memory cells of a stacked gate structure each having a control gate and a floating gate and in which information can electrically be erased and written, the switch MOSFET that applies an erase voltage for erase operation to source lines connected to the nonvolatile memory cells is controlled in such a way that it is turned off when a current flowing through the nonvolatile memory cells being erased reaches a specified value. This allows a change in the threshold voltage to be monitored by making use of the electrical characteristics of the nonvolatile memory cells, making it possible to prevent an excessive erasure operation from being carried out on the electrically erasable nonvolatile. memory cells.

DESCRIPTION OF THE PREFERRED EMBODIMENTS

Figure 1:
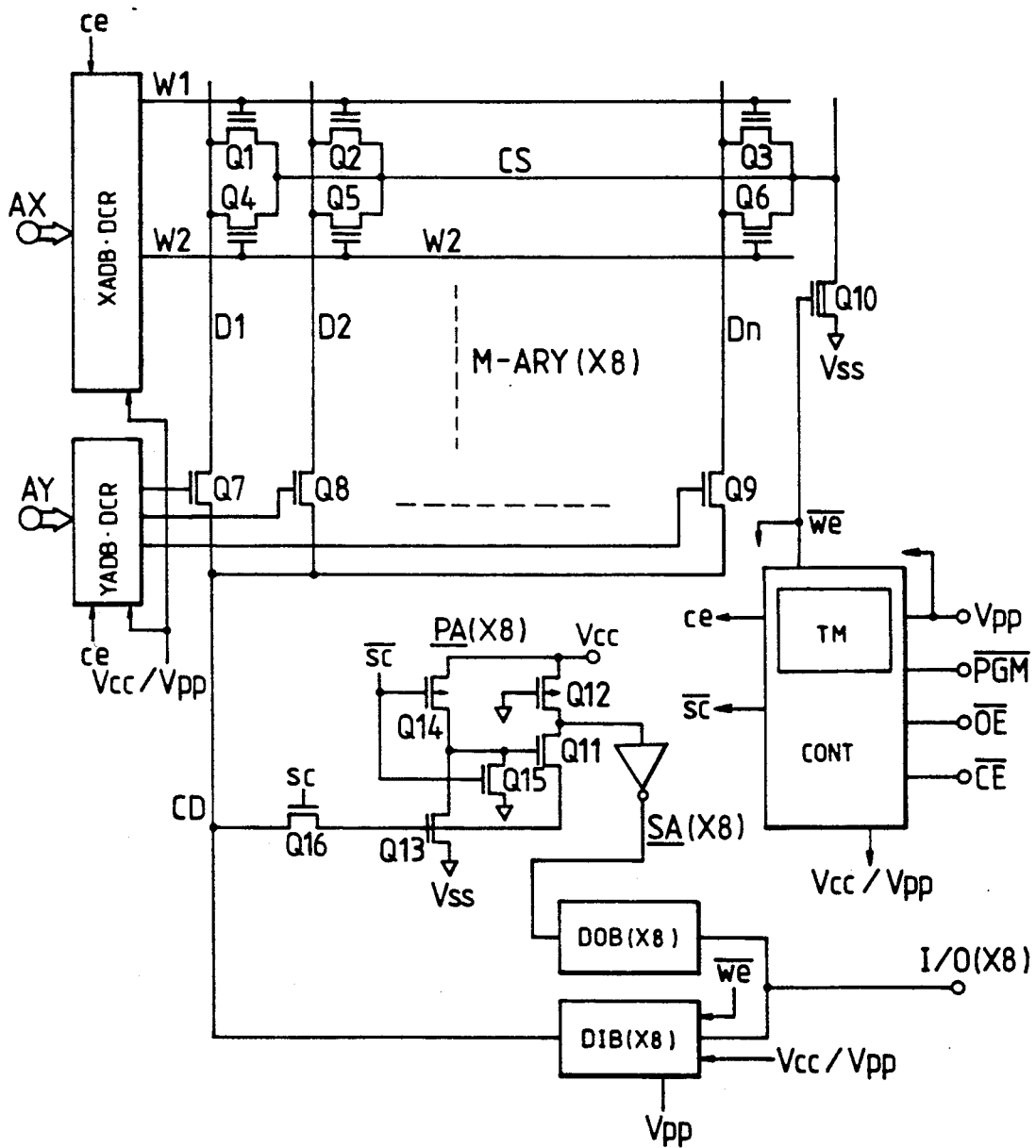
FIG. 1 is a circuit diagram showing the essential part of an EPROM as one embodiment of this invention.

FIG. 1 shows one example circuit of an EPROM to which this invention is applied. For simplicity, only the essential portion of the EPROM is shown. Each of the circuit elements in the figure is formed on a semiconductor substrate, such as a single monocrystal silicon, by using a known CMOS (complementary type MOS) integrated circuit manufacturing technique.

The integrated circuit is fabricated on, though not limited to, a semiconductor substrate formed of a monocrystal p-type silicon. The n-channel MOSFET consists of: a source region and a drain region, both formed on the surface of such a semiconductor substrate as mentioned above; and a gate electrode, formed of a polycrystalline silicon, on the semiconductor substrate surface between the source region and the drain region with a thin gate insulation film formed thereon. The p-channel MOSFET is formed in an n-type well region on the semiconductor substrate surface. In this construction a substrate gate is formed common to a plurality of n-channel MOSFETs on the semiconductor substrate, and the common gate is supplied with a ground potential of the circuit. The n-type well region forms the substrate gate for the p-channel MOSFET which is formed thereon. The substrate gate of the p-channel MOSFET, i.e., the n-type well region, is connected to a source voltage Vcc.

The integrated circuit may also be formed on a semiconductor substrate of a monocrystal n-type silicon. In this case, the n-channel MOSFET and the nonvolatile memory cell are formed in the p-type well region, and the p-channel MOSFET is formed on the n-type substrate.

In this example of an EPROM, an X-address signal AX and a Y-address signal AY are fed from external terminals (marked by "o") to address buffers. The address buffer generates complementary signals according to the X-address signal AX and the Y-address signal AY, and supplies these complementary address signals to respective address decoders DCR. The complementary address signal comprises an address signal virtually in synchronism with the address signal AX (AY) and an inverted address signal whose phase is virtually reversed to the address signal AX (AY). In the figure, the address buffer and the address decoder are combined and shown as one and the same block XADB·DCR and YADB·DCR for simplicity. That is, the XADB·DCR consists of an address buffer XADB for the X-address signal AX and a decoder DCR for decoding the complementary address signal from the address buffer XADB. Similarly, the YADB·DCR consists of an address buffer YADB for the Y-address signal AY and a decoder DCR for decoding the complementary address signal from the address buffer YADB. The above address buffers XADB, YADB are activated by an internal chip selection signal ce to take in the address signals AX, AY from external terminals and generate internal address signals in phase with the external address signals from the external terminals and complementary address signals in reverse phase with the external address signals.

The address decoder that receives the complementary address signal from the address buffer XADB, i.e., a row (X) address decoder DCR, decodes the complementary address signal from the address buffer XADB and generates a selection signal to select a word line specified by the X-address signal AX. In other words, the row address decoder DCR forms a selection signal that chooses, from among a plurality of word lines W1 to Wn making up the memory array M-ARY, a word line W specified by the X-address signal AX.

The address decoder that receives the complementary address signal from the address buffer YADB, i.e., a column (Y) address decoder DCR, decodes the complementary address signal from the address buffer YADB and generates a selection signal to select a data line D specified by the Y-address signal AY from among a plurality of data lines D1 to Dn making up the memory array M-ARY.

The row address decoder DCR and the column address decoder DCR are each supplied with a voltage Vcc/Vpp whose value can be selectively changed. The voltage Vcc/Vpp is placed at a value almost equal to the source voltage Vcc during the read operation, and during the write operation, at a value almost equal to a high write voltage Vpp. Thus, for reading, the row address decoder DCR applies a selection signal almost equal to the source voltage Vcc to the word line specified by the X-address signal AX. When writing, it applies a selection signal almost equal to the high write voltage Vpp to the specified word line. The column address decoder DCR applies a selection signal almost equal to the source voltage Vcc to the gate of a column switch MOSFET connected to the data line specified by the Y-address signal AY for the read operation. For the write operation, it applies a selection signal almost equal to the high write voltage Vpp to that gate.

The memory array M-ARY consists of memory cells of a stacked gate structure each with a control gate and a floating gate (nonvolatile memory cells: MOSFETQ1 to Q6), word lines W1, W2, . . . , Wn, and data lines D1, D2, ..., Dn. In the memory array M-ARY, the control gates of the memory cells Q1 to Q3 (Q4 to Q6) arranged on the same row are connected to a common word line W1 (W2). The drains of the memory cells Q1, Q4 (..., Q3, Q6) arranged on the same column are connected to a common data line D1 (..., Dn). The source of each memory cell is connected to the source line CS. In this example, the source line CS is applied with the, ground potential Vss of the circuit through a depletion type MOSFET Q10 which receives an internal write signal $\overline{we}$ at its gate.

The EPROM of this example performs the read/write operation eight bits at a time. For this purpose, a total of eight sets of the above memory array M-ARY are provided, as with an EEPROM which will be described later by referring to FIG. 4. In FIG. 1, only one memory array M-ARY is representatively shown for simplicity.

While in the following our description concerns mainly the memory array M-ARY shown in the figure, the same also applies to other memory arrays not shown. However, it should be noted that there is only one timing control circuit CONT (described later), which is common to all memory arrays. The X-address buffer and decoder XADB·DCR and the Y-address buffer and decoder YADB·DCR are also common to all memory arrays. And the MOSFET Q10 connected to the source line CS is common to all memory arrays. However, the X-and Y-address decoders may be provided separately for each memory array. It is also possible to connect an MOSFET equivalent to the above MOSFET Q10 to each source line of each memory array.

The data lines D1 to Dn making up one memory array M-ARY are each connected to the common data line CD through column selection switches MOSFET Q7 to Q9 that receive a selection signal generated by the column address decoder. As with an EEPROM to be described later in FIG. 4, the common data line CD is provided for each memory block. The common data line CD is connected to the output terminal of a write data input buffer DIB that accepts write data supplied from an external terminal I/O. Likewise, in other memory arrays M-ARY not shown, switch MOSFETs similar to the column selection switch MOSFETs are also provided. A selection signal is given to the corresponding switch MOSFET from the column address decoder.

The common data line CD that is provided for each memory array M-ARY is connected, through the switch MOSFET Q16, to the input terminal of a first-stage amplifier circuit PA--which forms the input circuit of a sense amplifier SA.

Next, we will explain about the first-stage amplifier circuit PA. The common data line CD, only one example of which is shown i the figure, is connected to the source of an n-channel type amplifier MOSFET Q11 through the switch MOSFET Q16 that is turned on by a read control signal sc. Between the drain of the amplifier MOSFET Q11 and the source voltage terminal Vcc is connected a p-channel type load MOSFET Q12 whose gate is applied with the ground potential of the circuit. The load MOSFET Q12 supplies a precharge current to the common data line CD for performing read operation. In this embodiment and the succeeding embodiments, an arrow is shown attached to the gate of only the p-channel type MOSFET for distinction from the n-channel type MOSFET.

To enhance the sensitivity of the amplifier MOSFET Q11, the voltage of the common data line CD is applied through the switch MOSFET Q16 to the gate of a drive MOSFET Q13. The drive MOSFET Q13 forms an input of a reverse amplifier circuit made up of the n-channel type drive MOSFET Q13 and the p-channel type load MOSFET Q14. The output voltage of the reverse amplifier circuit is supplied to the gate of the amplifier MOSFET Q11. To eliminate current consumption while the sense amplifier SA is not operated, an n-channel type MOSFET Q15 is provided between the gate of the amplifier MOSFET Q11 and the ground potential Vss of the circuit. The gates of the MOSFET Q15 and the p-channel MOSFET Q14 are commonly applied with a sense amplifier operation timing signal $\overline{sc}$.

When a memory cell is to be read, the sense amplifier operation timing signal $\overline{sc}$ is held low, turning the MOSFET Q14 on and the MOSFET Q15 off. The memory cell's threshold voltage is changed by the write operation to a value according to the data to be written into the memory cell. That is, according to the data being written, the write operation applies to the memory cell either a high threshold voltage or a low threshold voltage with respect to the word line selection level used in the read operation (in this example, almost Vcc).

In the read operation, when the memory cell selected by the row address decoder and the column address decoder is turned off even when the word line is placed at the selection level (almost Vcc), the common data line CD is set to a high-level (which, in actuality, is relatively low for a high level by the current supplied from the MOSFET Q12 and Q11. When on the other hand the selected memory cell is turned on by the word line selection level (almost Vcc), the common data line CD is set to a low-level (which, in actuality, is relatively high for a low level).

In this case, the high level of the common data line CD is limited to a relatively low potential because the gate of the MOSFET Q11 is applied with a relatively low level of output voltage from the reverse amplifier circuit (MOSFET Q13, Q14) that receives the potential of the CD high level. On the other hand, the low level of the common data line CD is limited to a relatively high potential because the gate of the MOSFET Q11 is applied with a relatively high level of voltage produced by the reverse amplifier circuit (MOSFET Q13, Q14) that receives the potential of the CD low level. In this way, the high level and low level of the common data line CD are each suppressed and this makes it possible to increase the read operation speed when the stray capacitance that limits the signal change speed in the common data line CD is coupled to the common data line. That is, when data is read out successively from a plurality of memory cells, it is possible to reduce the time it takes for the potential of the common data line CD to change from one level to another. For such a high speed read operation, the conductance of the load MOSFET Q12 is set relatively large.

The amplifier MOSFET Q11 amplifies the gate-earthed type source input and its output is transferred to the sense amplifier SA formed of a CMOS invertor circuit. The output signal of the sense amplifier SA is amplified by the corresponding data output buffer DOB, from which it is output as data through external terminal I/O to the outside. The write data supplied from the outside through the external terminal I/O is transferred to the common data line CD through the data input buffer DIB. In other memory arrays also, similar circuits to those used in the above memory array are provided between the common data line and the external terminal I/O. That is, they include a read circuit made up of an input circuit, a sense amplifier and a data output buffer and a write circuit consisting of a data input buffer.

The operations of the data input buffer DIB and the data output buffer DOB are controlled by a timing control circuit CONT described later. That is, during writing, the data input buffer DIB is activated, while the data output buffer DOB is activated during the read operation and verify operation. The external terminal I/O is commonly used by the data input buffer DIB and the data output buffer DOB.

The timing control circuit CONT generates timing signals such as internal control signals ce, sc, $\overline{sc}$, $\overline{we}$ according to the chip enable signal, output enable signal, program signal and write high-level voltage supplied to the external terminals $\overline{CE}$, $\overline{OE}$, $\overline{PGM}$, and Vpp. The timing control circuit CONT also generates the read low-level voltage Vcc and the write high-level voltage Vpp, either of which can be selectably supplied to the row and column address decoders and the data input buffer DIB.

The source voltages Vcc, Vss are applied from the outside through the external terminal. In this embodiment, the write high-level voltage Vpp is also applied through the external terminal Vpp. The source voltage Vcc is placed at about 5 V, while the write high-level voltage Vpp is set at about 12 V. As described above, the voltages Vcc/Vpp are selectively set to a value almost equal to the source voltage Vcc or a value almost equal to the high-level voltage Vpp.

When, with the write high-level voltage Vpp supplied, the chip enable signal $\overline{CE}$ is low (almost at Vss), the output enable signal $\overline{OE}$ is high (almost at Vcc) and the program signal $\overline{PGM}$ is low (almost at Vss), then the timing control circuit CONT decides that the write mode has been specified to the EPROM from the outside and raises the internal chip enable signal ce to a high level (Vcc) and lowers the internal write enable signal $\overline{we}$ to a low level (Vss). The row and column address decoders and the data input buffer DIB are supplied, in addition to the source voltages Vcc, Vss, with a high-level voltage Vpp as the operation voltage from the timing control circuit CONT. The word line, which is connected with the memory cell to be written into, is supplied with a selection signal of high-level voltage Vpp from the row decoder. The data line, which is connected with the memory cell to be injected with electrons, is supplied with data of high-level voltage Vpp from the data input buffer DIB. Thus, a channel saturating current flows through the memory cell that is connected both to the word line applied with a high-level voltage Vpp and to the data line applied with a high-level voltage Vpp. In the pinch-off region near the drain connected to the data line, electrons are accelerated by an intense electric field and become ionized, producing so-called hot electrons—electrons with high energy. At this time, the floating gate voltage of the memory cell is determined by the control gate voltage connected to the word line and the drain voltage and by the capacitance between the substrate and the floating gate and the capacitance between the floating gate and the control gate. The hot electrons are then attracted to the floating gate. As a result, the potential of the floating gate becomes negative. This means that if the potential of the word line connected to the control gate of the memory cell is set to the selection state (in this example 5 V) during the read operation, the memory cell does not conduct. In this way, the memory cell is written with a logic "1" (or logic "0").

On the other hand, when a logic "0" (or logic "1") is to be written into the memory cell specified by the address signals AX, AY, i.e., when the electrons are not injected into the control gate as in the above case, the potential of the data line connected to the drain of the memory cell is limited to a low value. In other words, the potential of the drain of the memory cell is so low that the no hot electrons will be produced in the pinch-off region near the drain.

As will be described later in more detail by referring to FIG. 2, when the internal write enable signal $\overline{we}$ goes low, the data input buffer DIB applies a write high-level voltage Vpp or a relatively low voltage to the common data line CD according to the data supplied from the external terminal I/O.

When the chip enable signal $\overline{CE}$ goes low (Vss), the output enable signal $\overline{OE}$ goes low (Vss), the program signal $\overline{PGM}$ goes high (Vcc) and Vpp is set to the write high-level voltage Vpp, then the timing control circuit CONT determines that a verify mode has been specified to the EPROM from the outside and thus raises the internal signals sc and ce to a high level (Vcc). With the verify mode specified, the timing control circuit CONT switches the voltage Vcc/Vpp from the high-level voltage Vpp to the source voltage Vcc and supplies it to the row and column address decoders DCR and the data input buffer DIB.

When the chip enable signal $\overline{CE}$ goes low (Vss), the output enable signal $\overline{OE}$ goes low (Vss), the program signal $\overline{PGM}$ goes high (Vcc) and the Vpp is set to the read low-level voltage (virtually the same level as the source voltage Vcc), the timing control circuit CONT decides that the read mode has been specified to the EPROM from the outside and thus raises the internal signals sc and ce to a high level (Vcc).

In the read mode, the timing control circuit CONT switches the voltage Vcc/Vpp to the source voltage Vcc before outputting it. In this way, during the read mode and the verify mode, the row address decoder supplies a selection signal with a potential almost equal to the source voltage Vcc to the word line that was specified by the address signal AX. At the same time, the column address decoder supplies a selection signal with a potential almost equal to the source voltage Vcc to the column switch MOSFET that is connected to the data line specified by the address signal AY. This causes the data retained in the memory cell specified by the address signals AX, AY to be read out.

In this example, the timing control circuit CONT is provided with a timer circuit TM to prevent excessive writing. This timer circuit TM is started when the write high-level voltage Vpp is applied to the external terminal, the chip enable signal $\overline{CE}$ goes low (Vss), the output enable signal $\overline{OE}$ goes low (Vss) and the program signal $\overline{PGM}$ goes low (Vss). Once the timer is started, if the program signal $\overline{PGM}$ continues to be low (Vss) for an extended duration and when the time preset in the timer circuit TM is reached, the internal write signal $\overline{we}$—which places the memory cell made up of stacked gate transistors at the write state—is returned from low level (Vss) to high level (Vcc) to end the write operation. That is, even when the program signal $\overline{PGM}$ is made low (Vss) longer than the preset time of the timer circuit TM, the internal write enable signal $\overline{we}$ is changed from low level (Vss) to high level (Vcc) when the preset time has passed. This protects the memory cells against excess writing.

Figure 2:
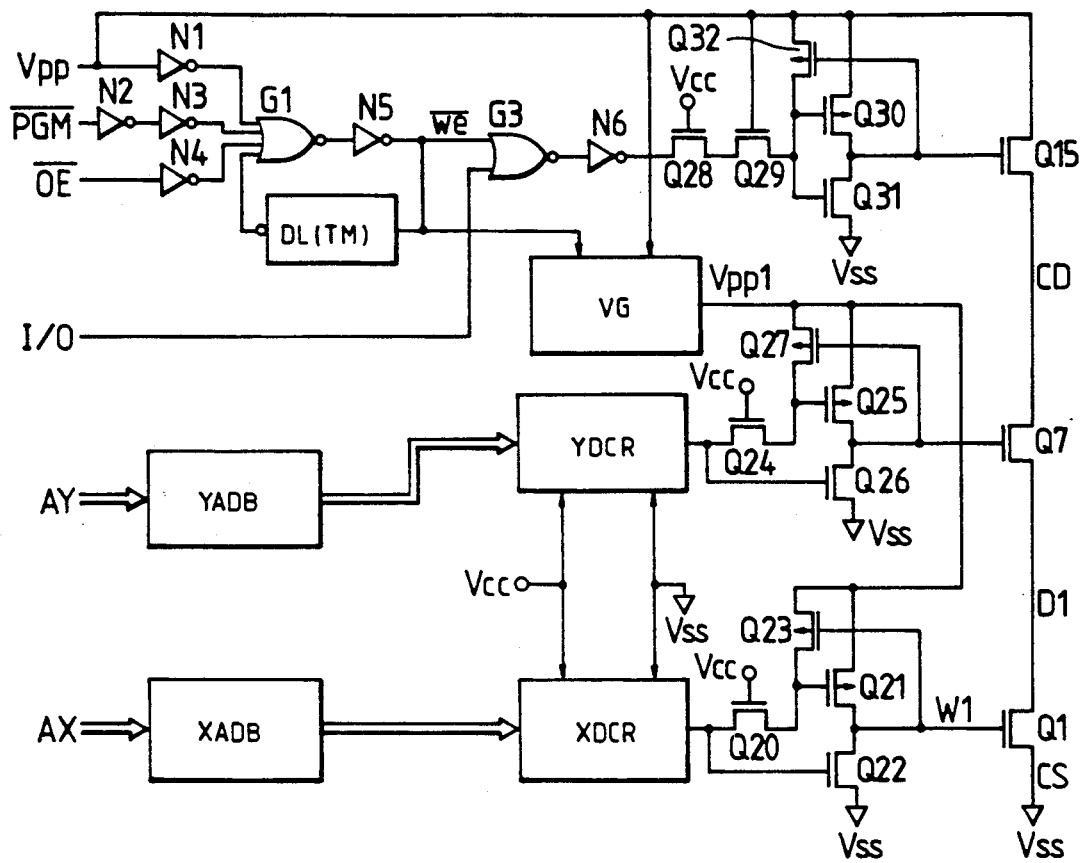
FIG. 2 is a circuit diagram showing an example of a write circuit in the EPROM of FIG. 1.
Figure 3:
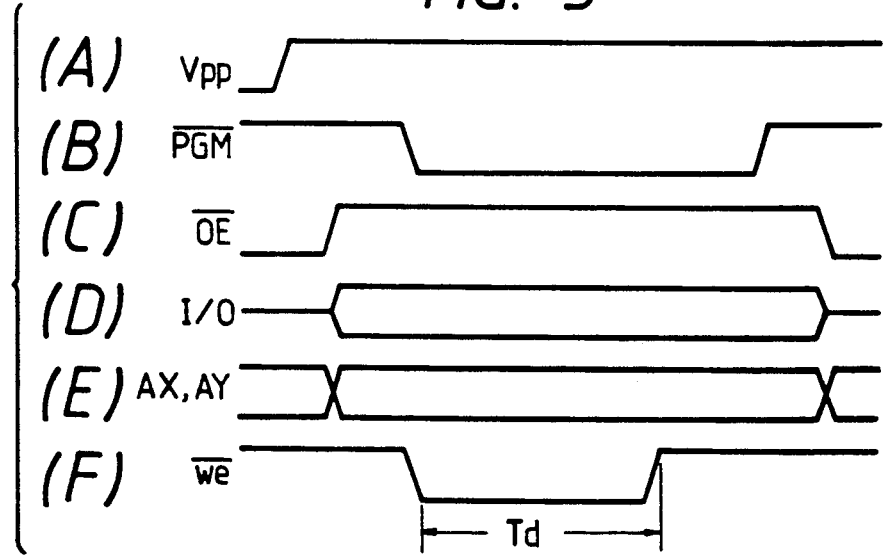
FIG. 3 (A to F) is a timing diagram illustrating the operation of the EPROM of FIG. 1 and FIG. 2.

FIG. 2 shows a detailed circuitry of the EPROM as shown in FIG. 1. This figure picks up one memory cell Q1 from among many memory cells of FIG. 1 as an example and shows the path for writing data into that memory cell.

Figure 10:
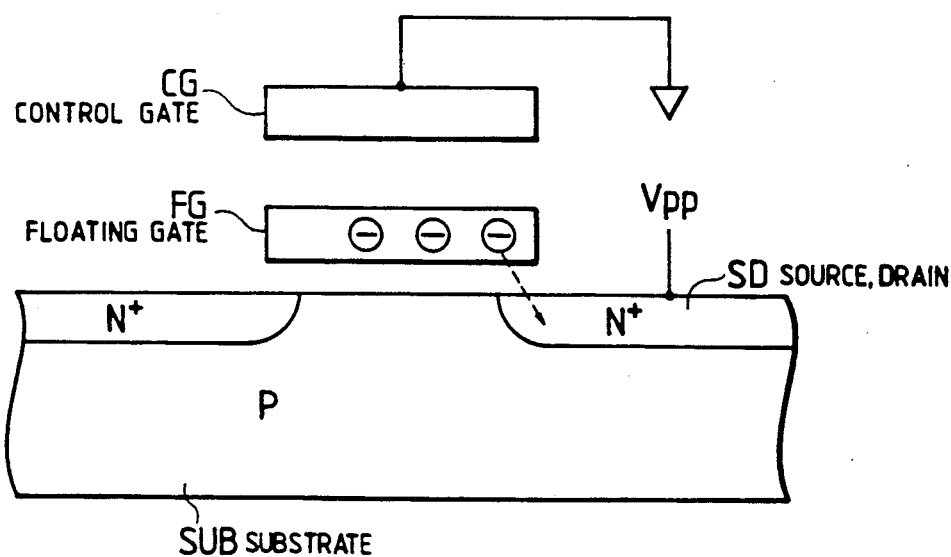
FIG. 10 is a simplified view showing the structure of a nonvolatile memory cell during the erase operation.

The source of the memory cell Q1 is applied with the ground potential Vss of the circuit through a MOSFET Q10 of depletion type, which is shown in FIG. 10. The figure omits the depletion type MOSFET Q10 which receives the internal write enable signal $\overline{we}$. The word line W1 coupled with the control gate of the memory cell Q1 is connected to the output terminal of a level conversion circuit that receives the selection signal generated by the address buffer XADB and the unit decoder circuit XDCR.

The address buffer XADB corresponds to the address buffer XADB of FIG. 1 and receives the X-address signal AX to generate a complement address signal. The row address decoder shown in FIG. 1 consists of, though not limited to, a plurality of unit decoder circuits XDCR and a plurality of level conversion circuits that receive the selection signal from the unit decoder circuits XDCR. The level conversion circuits have one-to-one correspondence with the unit decoder circuits. The unit decoder circuits XDCR are provided one for each of the word lines W1 to Wn. Thus, the row address decoder shown in FIG. 1 has the same number of unit decoder circuits XDCR and level conversion circuits as the number of word lines.

The level conversion circuits are similar in configuration to each other and the unit decoder circuits XDCR are also formed in similar configurations. However, the combinations of complement address signals supplied to different unit decoder circuits XDCR are made different from each other to select a unique word line from among many. Each of the unit decoder circuits XDCR is, for example, formed of NAND circuits. When an address signal AX specifying a desired word line is supplied to the address buffer XADB, the address buffer XADB outputs a complement address signal. The unit decoder circuit XDCR corresponding to the specified word line generates a low-level selection signal (almost Vss). The remaining unit decoder circuits XDCR all generate high-level non-selection signal (almost Vcc).

FIG. 2 shows only one of these unit decoder circuits XDCR that corresponds to the word line W1, and only one of the level conversion circuits that receives the output signal from that unit decoder circuit XDCR. The level conversion circuit consists of: a CMOS invertor circuit made up of a p-channel MOSFET Q21 and an n-channel MOSFET Q22 that use as an operation voltage a step-up voltage Vppl generated by a step-up circuit VG; a p-channel MOSFET Q23 provided between the voltage Vppl and the gate of the p-channel MOSFET Q21, the gate of the p-channel MOSFET Q23 being connected to the output node of the level conversion circuit (word line W1); and a cut MOSFET Q20 for transferring the output signal of the unit decoder circuit XDCR to the gate of the p-channel MOSFET Q21. The cut MOSFET Q20 is always supplied at its gate with 5 V source voltage Vcc. The gate of the n-channel MOSFET Q22 forming the CMOS invertor circuit is connected, not to the gate of the p-channel MOSFET Q21, but directly to the output node of the unit decoder circuit XDCR. However, the gate of the n-channel MOSFET Q22 may be connected commonly to the gate of the p-channel MOSFET Q21.

The operation of the level conversion circuit is as follows. When the unit decoder circuit XDCR produces a low-level selection signal (Vss), the n-channel MOSFET Q22 turns off and a low-level signal at a ground potential Vss of the circuit is applied to the p-channel MOSFET Q21 through the MOSFET Q20. This turns on the p-channel MOSFET Q21, through which the high-level voltage Vppl is applied to the word line W1 to be selected.

When the unit decoder circuit XDCR produces a high-level non-selection signal (5 V), the n-channel MOSFET Q22 turns on bringing the word line W1 to low level at the circuit ground potential Vss. With the word line W1 at low level, the p-channel MOSFET Q23 turns on applying a high-level voltage Vppl to the gate of the p-channel MOSFET Q21, which is then turned off. When the gate voltage of the p-channel MOSFET Q21 is raised higher than the source voltage Vcc, the MOSFET Q20 is turned off, thereby preventing a current from flowing from the step-up voltage Vppl to the source voltage Vcc, an operation voltage of the unit decoder circuit XDCR.

In FIG. 2, YADB corresponds to the column address buffer YADB of FIG. 1. YDCR of FIG. 2 is a unit decoder circuit. The column address decoder of FIG. 1 comprises a plurality of unit decoder circuits YDCR and a plurality of level conversion circuits that receive the output signal from each unit decoder circuit YDCR. Like the aforementioned row address system, the unit decoder circuits YDCR have one-to-one correspondence with the level conversion circuits and also with the data lines. The unit decoder circuits YDCR are each formed in similar configurations. The combinations of complement address signals supplied from the column address buffers YADB are made different from each other to access a desired data line, from among many data lines, according to the Y-address signal AY. The output signal of each unit decoder circuit YDCR is supplied—through a level conversion circuit (made up of MOSFET Q24 to Q27) that is formed in the same configuration as that of the aforementioned level conversion circuit (made up of MOSFET Q20 to Q23)—to the gate of a column switch MOSFET connected to the corresponding data line. As with the aforementioned unit decoder circuit XDCR, the unit decoder circuit YDCR that corresponds to the data line to be selected generates a low-level selection signal (Vss) according to the complement address signal from the address buffer YADB. The remaining unit decoder circuits YDCR all generates a high-level non-selection signal (Vcc).

FIG. 2 shows only one of these unit decoder circuits YDCR that corresponds to the data line D1, and only one of the level conversion circuits that receives the output signal from that unit decoder circuit YDCR.

The data line D1 coupled to the drain of the memory cell Q1 is connected to the common data line CD through a column switch MOSFET Q7. The column switch MOSFET Q7 has its gate supplied with the output signal of the level conversion circuit (Q24 to Q27) that receives a selection signal generated by the unit decoder circuit YDCR, which in turn receives a complement signal from the address buffer YADB. This level conversion circuit has the same configuration as that of the aforementioned level conversion circuit. When a low-level selection signal is supplied, the level conversion circuit produces the voltage Vppl. In this configuration, when during the write operation the data line D1 is selected, the gate of the column switch MOSFET Q7 is applied with a high-level voltage such as the step-up voltage Vppl.

The voltage produced by the step-up circuit VG is supplied to a plurality of level conversion circuits contained in the X-address decoder and to a plurality of level conversion circuits contained in the Y-address decoder. Among many level conversion circuits to which the output voltage of the step-up circuit VG is supplied, FIG. 2 shows only two level conversion circuits—one that corresponds to the word line W1 and one that corresponds to the column switch MOSFET Q7. This voltage is also supplied similarly to the remaining level conversion circuits that are not shown in the figure.

The step-up circuit VG receives the high-level voltage Vpp supplied through the external terminal Vpp and the internal write enable signal $\overline{we}$ described later. When the internal write enable signal $\overline{we}$ goes low (Vss), the step-up circuit VG steps up the high-level voltage Vpp to a high-level voltage of, say, about 14 V. The stepped-up high-level voltage is output as the voltage Vppl. When the internal write enable signal $\overline{we}$ is high (Vcc), it produces a voltage almost equal to the source voltage Vcc, which is output as the voltage Vppl. The step-up circuit VG shown in the figure, therefore, can be regarded as comprising two sections: one is a step-up circuit section that raises the high-level voltage Vpp in response to the internal write enable signal $\overline{we}$ going low; and the other is a voltage switching section that, in response to the internal write enable signal $\overline{we}$ going high, outputs the source voltage Vcc as the voltage Vppl instead of the stepped-up voltage from the step-up circuit. Although, in FIG. 2, the voltage is shown as Vppl for simplicity, it is understood from the foregoing descriptions that Vppl is identical with Vcc/Vpp of FIG. 1.

The data input buffer DIB as shown in FIG. 1 is applied with a high-level voltage Vpp through the external terminal Vpp and also with the voltage Vcc/Vpp. On the other hand, in the data input buffer DIB of FIG. 2—which will later be detailed—only the high-level voltage Vpp is shown supplied to the data input buffer DIB for simplicity of explanation. It is possible to supply the voltage Vppl to the gate of the MOSFET Q29, the source of MOSFET Q30 and the source of MOSFET Q32, these MSOFETs forming the level conversion circuit in the data input buffer DIB, and also supply the voltage Vpp to the source of MOSFET Q15. In this configuration, when the high-level voltage Vpp is transferred through the MOSFET Q15 to the common data line CD, the level conversion circuit (MOSFET Q28 to Q32) outputs the voltage Vppl which is higher than the high-level voltage Vpp. This prevents a level loss in the MOSFET Q15.

The above data input buffer DIB consists of the following circuits. The write data supplied from the outside through the input/output terminal I/O is input to a NOR gate G3 that is controlled by the internal write control signal $\overline{we}$. The output signal from the NOR gate G3 is supplied to an invertor N6, whose output signal is then transferred to the input node of the level conversion circuit through a cut MOSFET Q28 and a transmission gate MOSFET Q29. The level conversion circuit (MOSFET Q30 to Q32) is formed similar to, though not limited to, the aforementioned level conversion circuit (MOSFET Q20 to Q23). The level conversion circuit consists of: a p-channel MOSFET Q30, an n-channel MOSFET Q31 and a p-channel MOSFET Q32, which receive the high-level voltage Vpp as an operation voltage at their sources. The cut MOSFET Q28 has its gate constantly supplied with the source voltage Vcc, and the transmission gate MOSFET Q29 has its gate constantly supplied with the high-level voltage Vpp. The output signal of the level conversion circuit is applied to the gate of the switch MOSFET Q15, which transfers the write high-level voltage Vpp to the common data line CD.

Of various circuits contained in the timing control circuit CONT, only the logic circuit that dictates the write operation and the timer circuit are shown in FIG. 2.

The high-level voltage Vpp applied to the external terminal is supplied to a first input node of the NOR gate G1 through an invertor N1 which converts the high level signal to a 5 V-level signal. The program signal $\overline{PGM}$ applied to the external terminal is supplied to a second input node of the NOR gate G1 through invertors N2 and N3. The output enable signal $\overline{OE}$ applied through the external terminal is supplied to a third input node of the NOR gate G1 through an invertor N4. The NOR gate G1 produces a high-level output (logic "1") when the input signals at all three input nodes are low (logic "0"). The high-level output indicates that the write operation has been specified to the EPROM. That is, when the external terminal Vpp of the EPROM is applied with a high-level voltage Vpp of 12 V, the program enable signal $\overline{PGM}$ goes low and the output enable signal $\overline{OE}$ goes high, the NOR gate G1 produces a high-level output, instructing the EPROM to perform the write operation. For simplicity, the drawing omits the condition that the low-level chip enable signal $\overline{CE}$ is applied to the external terminal.

The output signal of the NOR gate G1 is inverted by the invertor N5. When the write condition is established—i.e., when the high-level voltage Vpp is applied to the external terminal Vpp, the low-level program signal $\overline{PGM}$ is supplied to the external terminal, the high-level output enable signal $\overline{OE}$ is supplied to the external terminal $\overline{OE}$ and the low-level chip enable signal $\overline{CE}$ is supplied to the external terminal $\overline{CE}$—invertor N5 causes the internal write enable signal $\overline{we}$ to go low. This opens the NOR gate G3—which forms the input section of the data input buffer DIB—allowing the write data from the external terminal I/O to be taken into the EPROM.

Figure 14:
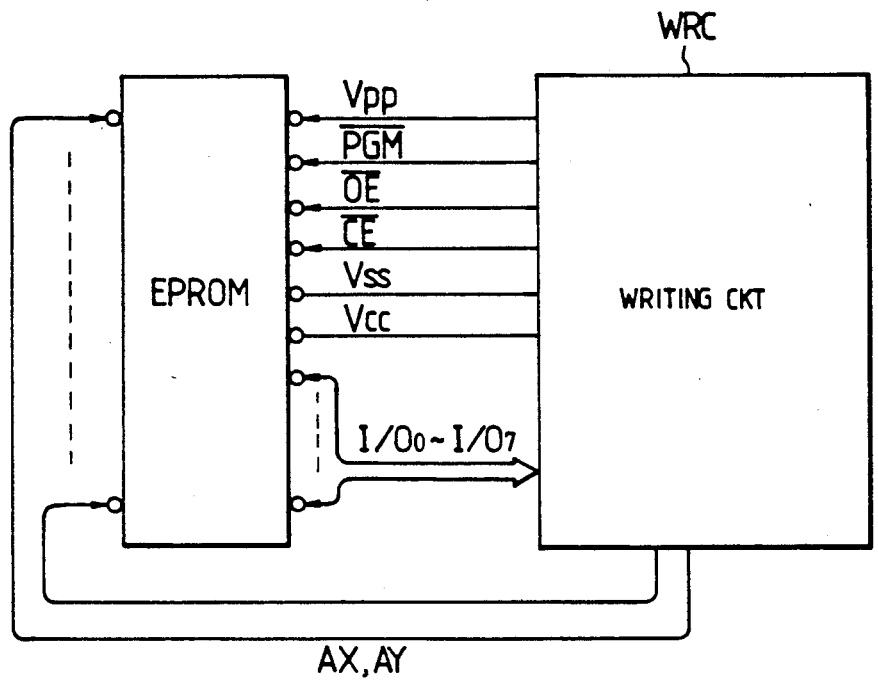
FIG. 14 is a system diagram showing a system for writing information into the EPROM.

The timer circuit TM consists of an inversion delay circuit DL that receives the internal write enable signal $\overline{we}$. The delay output of the circuit DL is fed back to the fourth input node of the NOR gate G1. That is, the internal write enable signal $\overline{we}$ is inverted in phase by the inversion delay circuit DL and then fed back to the NOR gate G1. When, for example, the EPROM that applies this invention is to be written by a writing circuit WRC, as shown in FIG. 14, a set of signals—the high-level voltage Vpp, program signal $\overline{PGM}$, output enable signal $\overline{OE}$, chip enable signal $\overline{CE}$, write data or data to be written into I/O$_0$ to I/O$_7$ and X- and Y-address signals AX, AY that specify the location of memory the data is to be written into—are supplied to the external terminals of EPROM from the writing circuit WRC. The EPROM is inserted into a socket in the writing circuit WRC for the data to be written. Therefore, the source voltages Vcc, Vss fed to the external terminals of EPROM are also supplied from the writing circuit WRC. In order for the writing circuit WRC to perform the verify operation, the data is supplied to the writing circuit WRC from the EPROM. If the program signal $\overline{PGM}$, which dictates the write operation from this writing circuit WRC, is preset to be low for more than a standard time duration, the output signal of the inversion delay circuit DL changes to a high level (logic "1") when a specified time has elapsed after the program signal $\overline{PGM}$ changed to a low level. This causes the output of the NOR-gate G1 to change from high level to low level after the elapse of a specified time even if the program signal $\overline{PGM}$ supplied to the external terminal of EPROM is kept low. As a result, the internal write enable signal $\overline{we}$ changes from low level to high level, automatically terminating the write operation.

FIG. 3(A) to (E) shows a timing diagram for the signals supplied from the writing circuit WRC to the EPROM, i.e., the high-level voltage Vpp, the program signal $\overline{PGM}$, the output enable signal $\overline{OE}$, the data to be written into, and the address signals AX, AY that specifies the location of the desired memory cell in which the data is to be written. FIG. 3(F) shows the timing diagram of the internal write enable signal $\overline{we}$ that is formed inside the EPROM.

The aforementioned write operation may easily be understood from the timing diagram of FIG. 3(A) to (F). Let us consider a case in which the low-level program signal $\overline{PGM}$ is supplied from the writing circuit WRC to the EPROM to request the write operation and in which the program signal $\overline{PGM}$ specifies an unnecessarily long duration for write operation. In this case, the output signal of the inversion delay circuit DL changes from low level (Vss) to high level (Vcc) when the preset delay time Td of the inversion delay circuit DL is reached, forcing the internal write enable signal $\overline{we}$ to return to high level and thereby terminate the write operation.

In other words, when the request for write operation on the desired memory cell in the EPROM continues longer than the duration specified by the inversion delay circuit DL, the write operation is forcibly ended regardless of whether there is any external request for writing into the EPROM. On the other hand, when the external request for writing into EPROM persists shorter than the duration specified by the inversion delay circuit DL but long enough to write data into the memory cell, the write operation on the EPROM is terminated according to the external request for ending the write operation.

The incorporation of such a timer function into the EPROM limits the duration of write operation in the EPROM when an excessively long write time is erroneously set in the writing-circuit WRC. This means that too long a write time setting is ignored, preventing cell characteristic deterioration. This in turn assures a highly reliable nonvolatile memory device.

Figure 4:
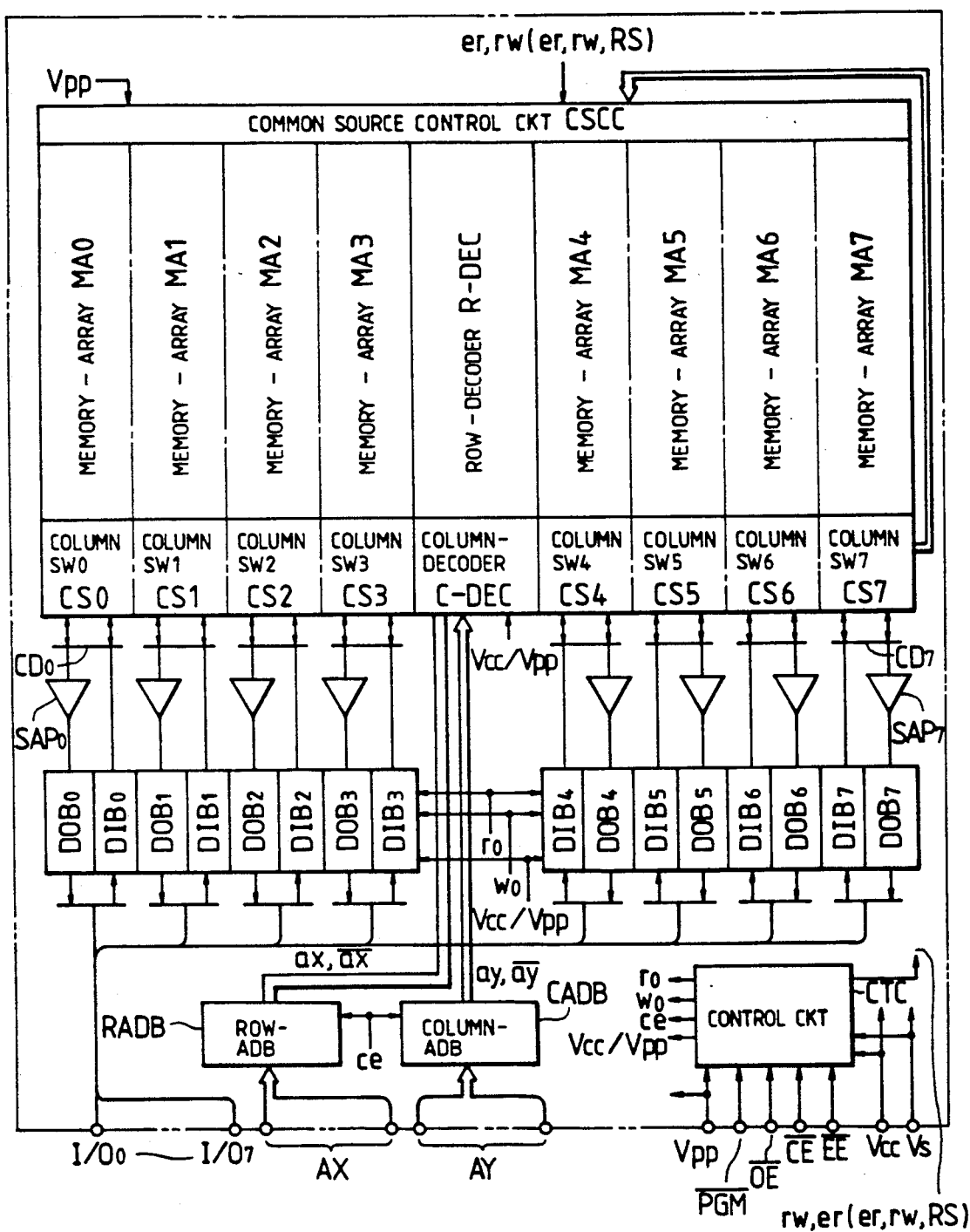
FIG. 4 is a block diagram showing one example of an EEPROM to which this invention is applied.

FIG. 4 is a block diagram showing one embodiment of the EEPROM that applies this invention. The EEPROM in the figure is a so-called flash type EEPROM. The circuit blocks enclosed by the two-dot line may be formed on a semiconductor substrate such as a monocrystal silicon by using a known CMOS (complementary MOS) integrated circuit manufacture technology.

The integrated circuit may be formed on a semiconductor substrate of a monocrystal p-type silicon. The n-channel MOSFET consists of a source region and a drain region, both formed on the surface of such a semiconductor substrate, and a gate electrode which is formed of a polycrystalline silicon on the semiconductor substrate surface between the source region and the drain region with a thin gate insulation film formed thereon. The p-channel MOSFET is formed in the n-type well region on the semiconductor substrate surface. Thus the semiconductor substrate forms a common substrate gate for a plurality of n-channel MOSFETs manufactured thereon and is supplied with the ground potential of the circuit. The n-type well region forms a substrate gate for the p-channel MOSFETs fabricated thereon. The p-channel MOSFET's substrate gate, i.e., n-type well region is connected to the source voltage Vcc.

The integrated circuit may also be formed on a semiconductor substrate of a monocrystal n-type silicon. In this case, the n-channel MOSFETs and the nonvolatile memory cells are formed in the p-type well region, while the p-channel MOSFETs are formed on the n-type substrate.

In FIG. 4, MA0 to MA7 each represent memory cell arrays with the same configuration. The memory cell array (say, MA0) has a plurality of word lines, a plurality of data lines, and memory cells each formed at the intersection of the word line and the data line. In this example, a common row address decoder R-DEC is provided for all memory arrays MA0 to MA7. The row address decoder R-DEC decodes the complement address signals ax, $\overline{ax}$ output from a row address buffer RADB to select one word line from each memory cell array. The word lines to be selected are applied with the high-level voltage Vpp (say, about 12 V) from the row address decoder R-DEC during the write operation and, during the read operation, it is applied with a voltage almost equal to the source voltage Vcc (say, 5 V). For the erase operation, the word lines are applied with a voltage almost equal to the circuit ground potential Vss (say, 0 V) from the row address decoder R-DEC. During the write and read operations, the voltage almost equal to the circuit ground potential Vss is supplied to other word lines that are not selected from the row address decoder R-DEC.

In this figure, CS0 to CS7 represent column switches that have similar configurations. The column switches (say, CS0) have one-to-one correspondence with the memory cell arrays (MA0) and selects one data line from among many data lines in the corresponding memory cell array (MA0) according to a selection signal from a column address decoder C-DEC common to all column switches. The column address decoder C-DEC receives complement address signals ay, $\overline{ay}$ from a column address buffer CADB and decodes them to generate a selection signal that specifies one data line from among many data lines. In this example, during the write operation the column address decoder C-DEC produces a selection signal with a voltage equal to the high-level voltage Vpp and a non-selection signal with a voltage equal to the circuit ground potential Vss. During the read operation, the column address decoder C-DEC produces a selection signal with a voltage almost equal to the source voltage Vcc and a non-selection signal with a voltage almost equal to the ground potential Vss.

The data line selected by the column switch (CS0) is electrically connected to a common data line (CD$_0$). In the read operation, data transferred to the common data line (CD$_0$) is amplified by a sense amplifier (SAP$_0$) and transferred through a data output buffer (DOB$_0$) to an external terminal (I/O$_0$), from which it is output to external circuits. In the write operation, data to be written is supplied through the external terminal (I/O$_0$) to a data input buffer (DIB$_0$), in which the write data is converted into a high-level signal. The data is then transferred to the common data line (CD$_0$) and further to the selected data line through the column switch (CS$_0$). Then, the write data is written into the memory cell connected to the selected word line.

Sense amplifiers SAP$_1$ to SAP$_7$ have the same configuration as that of the sense amplifier SAP$_0$ and are connected to the corresponding memory cell arrays MA1 to MA7 through associated common data lines CD$_1$ to CD$_7$ and column switches CS1 to CS7. The outputs of the sense amplifiers SAP$_1$ to SAP$_7$ are each connected the corresponding external terminals I/O$_1$ to I/O$_7$ through the associated data output buffers DOB$_1$ to DOB$_7$. During the data writing, as mentioned above, data from the external terminals I/O$_1$ to I/O$_7$ are transferred to the corresponding memory cell arrays MA1 to MA7 through the associated data input buffers DIB$_1$ to DIB$_7$, common data lines CD$_1$ to CD$_7$ and column switches CS1 to CS7. The data input buffers DIB$_1$ to DIB$_7$ are each formed in the same configuration as that of the data input buffer DIB$_0$, and the data output buffers DOB$_1$ to DOB$_7$ have the same configuration as that of the data output buffer DOB$_0$.

The row address buffer RADB receives, through external terminals AX, an X-address signal AX and generates the complement address signals ax, $\overline{ax}$ according to the address signal AX. The column address buffer CADB receives, through external terminals AY, a Y-address signal AY and generates the complement address signals ay, $\overline{ay}$ according to the Y-address signal.

In the figure, CTC is a timing control circuit, which receives the high-level voltage Vpp, program signal $\overline{PGM}$, output enable signal $\overline{OE}$, chip enable signal $\overline{CE}$, and erase enable signal $\overline{EE}$ from the external terminals Vpp, $\overline{PGM}$, E/, $\overline{CE}$ and $\overline{EE}$ to generate varied timing signals and at the same time output the voltage Vcc/Vpp. Of these timing signals, the figure only shows the internal chip enable signal ce for controlling the operation of the address buffers RADB, CADB, a control signal ro for controlling the operation of the data output buffers DOB$_0$ to DOB$_7$, a control signal wo for controlling the operation of the data input buffers DIB$_0$ to DIB$_7$, and control signals rw, er (er, rw, RS) for controlling the write and erase operations. In the following descriptions, the timing signals are formed by this timing control circuit unless otherwise specifically stated.

The timing control circuit CTC, in this example, has a switching circuit that outputs the high-level voltage Vpp (about 12 V) or the source voltage Vcc (about 5 V) as the voltage Vcc/Vpp according to the operation mode (read or write mode). In the read mode, the switching circuit outputs the source voltage Vcc as the voltate Vcc/Vpp and, in the write mode, outputs the high-level voltage Vpp as the voltage Vcc/Vpp. As shown in FIG. 4, the voltage Vcc/Vpp is supplied to the column address decoder C-DEC, the row address decoder R-DEC and the data input buffers DIB$_0$ to DIB$_7$. The high-level voltage Vpp applied to the external terminal Vpp may be supplied to a common source control circuit CSCC, which is described later.

The external terminals Vss, Vcc shown in the figure receive the circuit ground potential Vss and the source voltage Vcc, both supplied from the outside of the EE-PROM, and supply these potentials to respective internal circuits.

Figure 5:
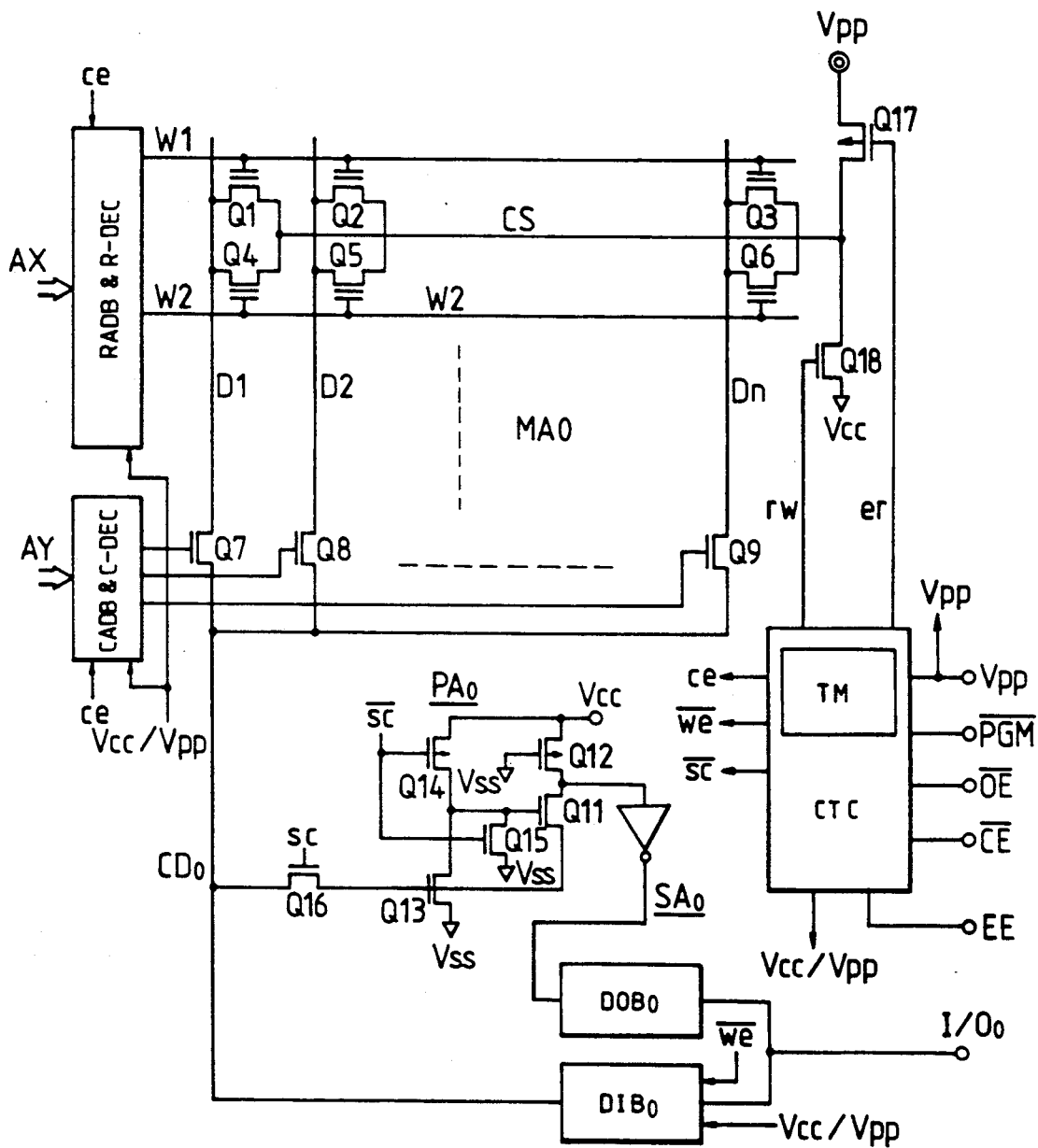
FIG. 5 is a circuit diagram showing the essential part of the EEPROM of FIG. 4.

Although one example will be described in detail later on by referring to FIG. 10, each of the memory cells in this embodiment consists of one MOSFET of a stacked gate structure. The MOSFET (memory cell) has a control gate and a floating gate, both connected to the associated word line, a drain or source connected to the associated data line, and a source or drain connected to the source line. The source lines connected to memory cells, in the case of FIGS. 4 and 5, are merged into one common source line which in turn is connected to the common source control circuit CSCC. For the write and read operations, the common source control circuit CSCC supplies the circuit ground potential Vss to the common source line. For the erase operation, the common source control circuit CSCC supplies the high-level voltage Vpp to each source line, erasing data in all memory cells at one time. However, like an example of FIG. 8, it is possible to divide the source lines into groups and the common source control circuit CSCC into plural unit common source control circuits and then apply the high-level voltage Vpp from a desired unit common source control circuit to a group of source lines, so that data can be erased from a desired part of the memory cells.

FIG. 5 shows one example circuitry of the memory cell array (MA0) and its associated circuits of the flash type EEPROM of FIG. 4. The circuits of FIG. 5 are basically the same as those of the EPROM shown in FIG. 1. For instance, RADB and R-DEC in FIG. 5 are identical with the row address buffer RADB and the row address decoder R-DEC of FIG. 4 and represent XADB·DCR in FIG. 1. CADB and C-DEC are identical with the column address buffer CADB and the column address decoder C-DEC of FIG. 4 and represent ADB·DCR in FIG. 1. MA0 corresponds to the memory cell array MA0 of FIG. 4 and represents M-ARY of FIG. 1. DOB$_0$ and DIB$_0$ are identical with the data output buffer DOB$_0$ and the data input buffer DIB$_0$ in FIG. 4 and represent the data output buffer DOB and the data input buffer DIB in FIG. 1. Further, the level conversion circuit for the data input buffers DIB$_0$ to DIB$_7$ is similar to the level conversion circuit (MOSFET Q28 to Q32) shown in FIG. 2. In the level conversion circuit in this example, the voltage supplied to MOSFETs Q29, Q30, Q32 is the voltage Vcc/Vpp. To the MOSFET corresponding to the MOSFET Q15 of FIG. 2 is supplied with the voltage Vcc/Vpp instead of the voltage Vpp. It should be noted that the signal ro for controlling the operation of the data output buffer DOB and the signal wo for controlling the operation of the data input buffer DIB are not shown. The Vcc/Vpp shown in FIG. 5 corresponds to the Vcc/Vpp of FIG. 4. Unlike the example of FIG. 1, the example of FIG. 5 has the high-level voltage Vpp or source voltage Vcc output as the voltage Vcc/Vpp. Thus, the level conversion circuit in each decoder is supplied with the voltage Vcc/Vpp, instead of the voltage Vpp of FIG. 2, which switches either to the source voltage Vcc or the high-level voltage Vpp. PA$_0$ and SA$_0$ shown in FIG. 5 represent PA and SA of FIG. 1. The PA0 and SA0 and MOSFET Q16 make up the sense amplifier SAP$_0$ shown in FIG. 4. In the figure, parts assigned with the same reference symbols as those in FIG. 1 have the same functions.

While FIG. 5 shows only the memory cell array MA0 and its associated circuits, the remaining memory cell arrays MA1 to MA7 have similar configurations. The EEPROM in this example performs input and output of data eight bits at a time.

In this example, in order for the data to be electrically erased as mentioned earlier, the source line CS in the memory cell array is provided with an n-channel MOSFET Q18 and a p-channel MOSFET Q17. The n-channel MOSFET Q18 is turned on by a control signal rw from the timing control circuit CTC during the read/write operation to apply the circuit ground potential Vss to the source line CS. The p-channel MOSFET Q17 is switched on by an erase signal er (described later)—which is formed by the timing control circuit CTC during the erase operation—to apply the erase high-level voltage Vpp to the source line CS. In the example of FIG. 5, the MOSFET Q18 and the MOSFET Q17 forms the common source control circuit CSCC shown in FIG. 4.

If a partial erasure of data is desired in each of the memory cell arrays MA0 to MA7, this can be accomplished by providing a plurality of source lines to each memory cell array and providing the switch MOSFETs Q17, Q18 to each of the source lines. When it is desired to erase data from the whole memory cells in each of the memory cell arrays MA0 to MA7, only one common source line CS is provided as mentioned earlier. And the MOSFETs Q17 and Q18 are provided to the common source line CS.

CTC in FIG. 5 corresponds to the timing control circuit CTC of FIG. 4. The timing control circuit CTC is provided with a timer circuit TM, as with the example of FIG. 1. With the write/erase high-level voltage Vpp applied to it through the external terminal Vpp, the timing control circuit CTC decides that a write mode has been specified to the EEPROM if a chip enable signal $\overline{CE}$ supplied through the external terminal $\overline{CE}$ to the timing control circuit CTC is low (at Vss), an output enable signal $\overline{OE}$ supplied through the external terminal $\overline{OE}$ to the timing control circuit CTC is high (at Vcc), and a program signal $\overline{PGM}$ supplied through the external terminal $\overline{PGM}$ to the timing control circuit CGC is low (at Vss).

When the write mode is specified, the timing control circuit CTC operates in a way similar to that described in the example of FIG. 1. As in the case of FIG. 1, the high-level voltage Vpp or low-level voltage, depending on the data to be written, is transferred from the data input buffer DIB$_0$ through the common data line CD$_0$ and the selected data line (say, D1) to the selected memory cell. In this way the data is written into the memory cell.

When the chip enable signal $\overline{CE}$ is low (at Vss), the output enable signal $\overline{OE}$ is low (at Vss), the program signal $\overline{PGM}$ is high (at Vcc), and the external terminal Vpp is applied with a high-level voltage, then the timing control circuit CTC decides that a verify mode has been specified to the EEPROM. In the verify mode, the timing control circuit CTC makes the internal signal $\overline{sc}$ go low and the internal signal ce go high (at Vcc). The internal signal sc virtually is a signal $\overline{sc}$ inverted in phase. In the verify mode, the voltage Vcc/Vpp is switched from the high-level voltage Vpp to the source voltage Vcc before being supplied to the X- and Y-address decoders R-DEC, C-DEC and the data input buffer DIB$_0$.

When the chip enable signal $\overline{CE}$ is low (at Vss), the output enable signal $\overline{OE}$ is low (at Vss), the program signal $\overline{PGM}$ is high (at Vcc), and the external terminal Vpp is applied with the read low-level voltage (equal to the source voltage Vcc), then the timing control circuit CTC decides that the read mode has been specified to the EEPROM. The timing control circuit CTC then raises the internal signals sc and ce to high level.

When the chip enable signal $\overline{CE}$ is low (at Vss), the output enable signal $\overline{OE}$ is high (at Vcc), the program signal $\overline{PGM}$ is high (at Vcc), and the external terminal Vpp is applied with the high-level voltage Vpp, then the timing control circuit CTC decides that an erase mode has been specified to the EEPROM. When the erase mode is specified, the timing control circuit CTC generates a low-level (Vss) internal signal (erase signal) er and a high-level (Vcc) internal signal $\overline{sc}$. At this time, in this example, a high-level (Vcc) internal signal ce is also produced. The erase mode can also be requested by giving a low-level (Vss) erase enable signal $\overline{EE}$ to the external terminal $\overline{EE}$, and a low-level (Vss) chip enable signal $\overline{CE}$ to the external terminal $\overline{CE}$ and a high-level voltage Vpp to the external terminal Vpp. In this case also, the timing control circuit CTC generates the aforementioned internal signals er, $\overline{sc}$ and ce.

When the erase mode is specified, the internal signal er causes the MOSFET Q17 to turn on allowing the erase high-level voltage Vpp to be fed to the source line CS. As a result, the charge stored in the floating gate of the memory cell Q1 is pulled into the source region by a tunnel phenomenon caused by the high-level voltage Vpp applied to the source (which actually works as a drain), thus erasing the data. The circuit provided in the timing control circuit CTC to generate the internal write enable signal (internal signal) $\overline{we}$ is formed in the same configuration as that of the corresponding circuit of FIG. 2. The data input buffer DIB$_0$, X-address buffer RADB, X-address decoder R-DEC, Y-address buffer CADB, and Y-address decoder C-DEC are also formed in similar configurations to those in FIG. 2.

The circuit that produces the internal signal er is also formed similar to the circuit of FIG. 2 which produces the signal $\overline{we}$. Since it is the p-channel MOSFET Q17 that is switched by the internal signal er, the signal er is held low at the ground potential of the circuit during the erase operation and, in a mode other than the erase mode, is held high at a high-level voltage Vpp. That is, the circuit that forms the signal er in general produces a signal with a level reverse to that of the output signal of the data input buffer. For this purpose, the inverter N2 is removed from the circuit of FIG. 2 (invertors N1 to N5, gate G1, and inversion delay circuit DL) that generates the signal $\overline{we}$; a new invertor is added to invert the output signal of the invertor N5; and the output signal of the added inverter is supplied to a level conversion circuit—similar to the level conversion circuit of FIG. 2 (MOSFETs Q20 to Q23)—to produce the internal signal er. The signal er is then supplied to the gate of the switch MOSFET Q17.

To perform the erase operation using the external terminal $\overline{EE}$, as described later referring to FIG. 7, the low-level internal signal er need be generated when the high-level voltage Vpp is applied to the external terminal Vpp and the low-level erase enable signal $\overline{EE}$ is applied to the external terminal $\overline{EE}$. In the EEPROM which performs such an electrical erasure operation, the erase time can be limited internally by providing a timer circuit to the circuit that forms the internal erase sinal er. This prevents an excessive erasing and therefore deterioration in the cell characteristics.

Figure 6:
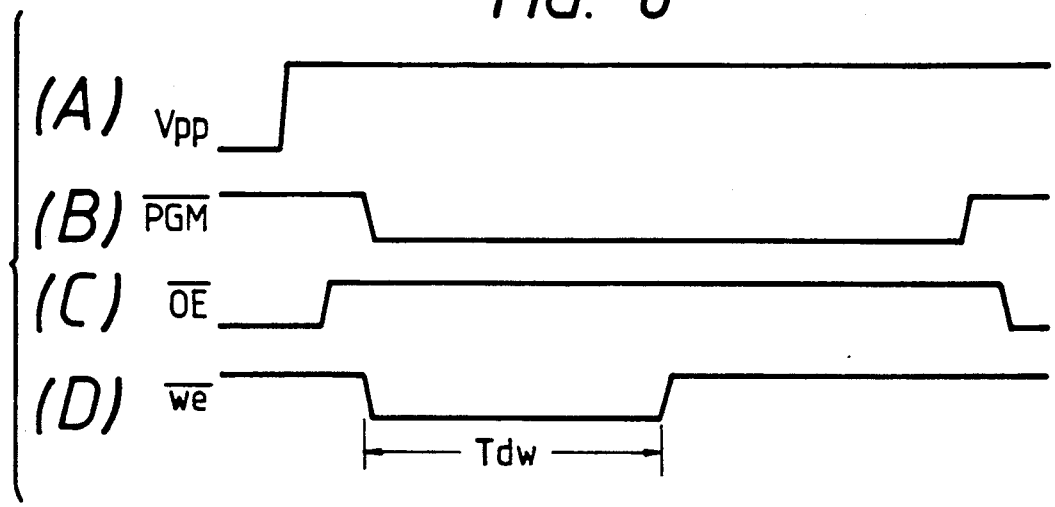
FIG. 6(A to D) is a timing diagram showing the write timing for the EEPROM to which this invention is applied.
Figure 15:
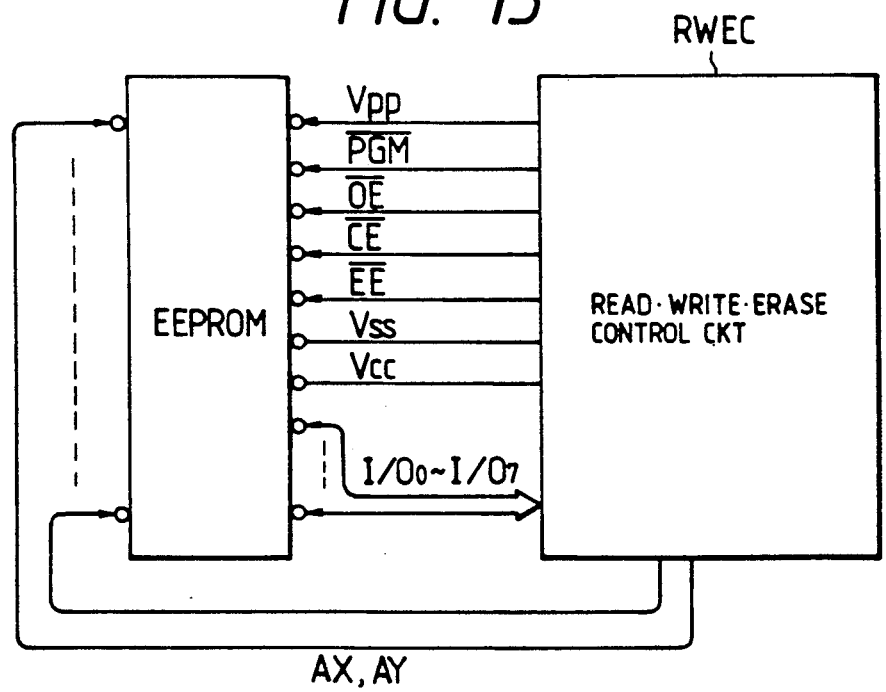
FIG. 15 is a system diagram showing a system for writing information into and erasing information from the EEPROM.

FIG. 15 is a system diagram showing one example of system including an EEPROM and a control circuit RWEC to read, write and erase data to/from the EEPROM. FIGS. 6 and 7 show the output waveforms of the control circuit WREC and the timing control circuit CTC, with FIG. 6 particularly illustrating the timing diagram during the write operation and FIG. 7 illustrating the timing diagram during the erase operation. The timing diagram of FIG. 7 represents the erase operation using the external terminal $\overline{EE}$.

Referring to FIG. 15, the EEPROM is supplied at its external terminals Vpp, $\overline{PGM}$, $\overline{OE}$, $\overline{CE}$, $\overline{EE}$ with a high-level voltage Vpp, program signal $\overline{PGM}$, output enable signal $\overline{OE}$, chip enable signal $\overline{CE}$ and erase signal $\overline{EE}$ from the control circuit RWEC. The data input/output terminals $I/O_0$ to $I/O_7$ of the EEPROM are connected to the control circuit RWEC for data transfer between them. To select a desired memory cell, the EEPROM is supplied with address signals AX, AY from the control circuit RWEC. In this example, the source terminals of the EEPROM Vcc, Vss are connected to the control circuit RWEC so that the source voltage can be supplied from the control circuit RWEC to the EEPROM.

In the write operation, as shown in FIG. 6(A) to (C), the control circuit RWEC supplies to the EEPROM the high-level voltage Vpp, program signal $\overline{PGM}$, output enable signal $\overline{OE}$, and address signals AX, AY to specify the memory cell which the data is to be written into. According to these signals, the timing control circuit CTC generates an internal write enable signal $\overline{we}$ that changes from high level to low level. When the program signal $\overline{PGM}$ is held low to specify the write operation on the selected memory cell for more than a specified duration, as shown in the timing diagram, the internal write enable signal $\overline{we}$ is returned from low level (Vss) to high level (Vcc) after the elapse of a specified delay time Tdw—which is preset by an inversion delay circuit in the write enable signal $\overline{we}$ generating circuit (consisting of inverters N1 to N5, gate G1 and inversion delay circuit DL of FIG. 2). With the internal write enable signal $\overline{we}$ raised to high level, the write operation is ended irrespective of the external write operation demand from outside the EEPROM.

Figure 7:
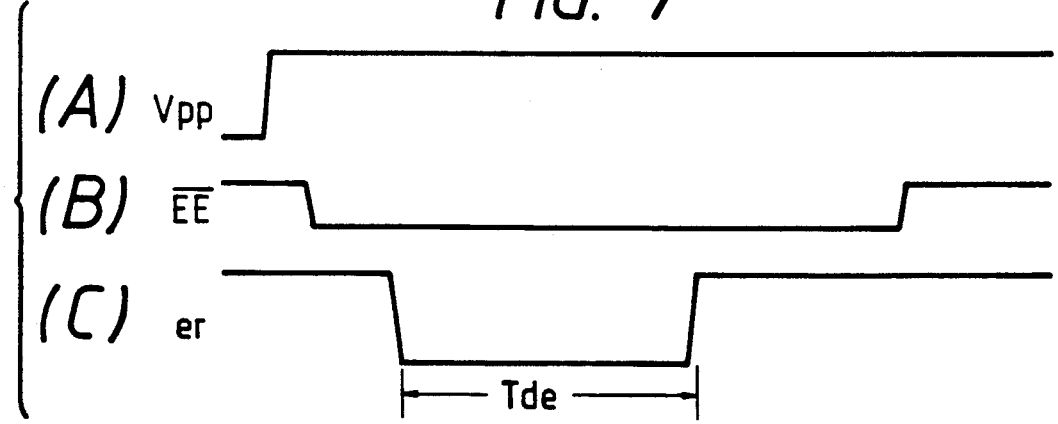
FIG. 7(A to C) is a timing diagram showing the erase timing for the EEPROM to which this invention is applied.

When, as shown in FIG. 7(A) and (B), the EEPROM receives signals from the control circuit RWEC, the timing control circuit CTC changes the internal erase signal er from high-level voltage Vpp to low level (ground potential Vss of the circuit) a specified time after the external erase signal EE has been changed to low level (Vss). In this case also, as with the write operation, if the external erase signal EE is held low for more than a specified time, the internal erase signal er is returned to the high-level voltage Vpp. To perform this operation, the erase signal er generating circuit is provided with an inversion delay circuit. When a specified time Tde preset in the inversion delay circuit has elapsed, the internal erase signal er returns from low level (Vss) to high level (Vpp) to end the erase operation from within the EEPROM regardless of the external erase command to the EEPROM. In FIGS. 6 and 7 the chip enable signal $\overline{CE}$ is not shown.

Figure 8:
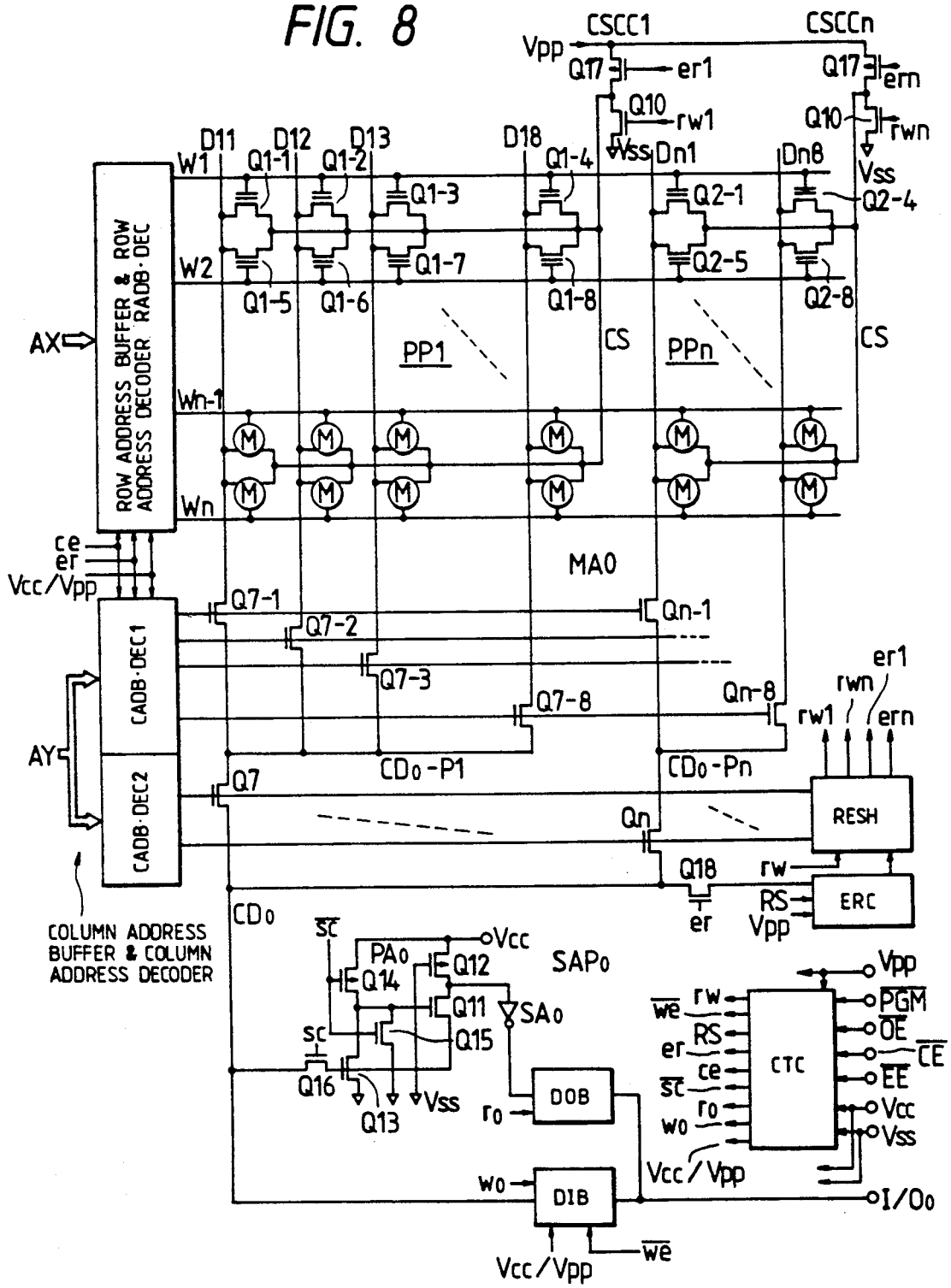
FIG. 8 is a circuit diagram showing an EEPROM as another embodiment of this invention.

FIG. 8 shows the second example of a flash type EEPROM of FIG. 4 that applies this invention. More particularly, FIG. 8 shows the circuitry of a memory cell array section and its associated circuits in the flash type EEPROM to which this invention is applied.

As described by referring to FIG. 4, the X- and Y-address signals AX, AY are supplied to the EEPROM through its external terminals. These X- and Y-address signals AX, AY are fed to address buffers RADB, CADB, which generate complement address signals ax, $\overline{ax}$, ay, $\overline{ay}$ that in turn are supplied to address decoders R-DEC, C-DEC. In FIG. 8, these address buffers and address decoders are shown as one circuit block RADB·DEC, CADB·DEC. In this example, the address buffers RADB, CADB are activated by the internal chip select signal ce to take in the address signals AX, AY from the external terminals and generate complement address signals ax, $\overline{ax}$, ay, $\overline{ay}$—which consist of internal address signals ax, ay in phase with the externally supplied address signals AX, AY and internal address signals $\overline{ax}$, $\overline{ay}$ in reverse phase with the external address signals AX, AY.

The row address decoder R-DEC decodes the complement address signals ax, $\overline{ax}$ from the row address buffer RADB to generate a selection signal which specifies, from among many word lines W1 to Wn, the word line addressed by the complement address signals ax, $\overline{ax}$.

The column address decoder C-DEC decodes the complement address signals ay, $\overline{ay}$ from the column address buffer CADB to generate a selection signal which specifies, from among many data lines D11 to D18, ..., Dn1 to Dn8, the data line addressed by the complement address signals ay, $\overline{ay}$.

The memory cell array MA0 in this example has n memory blocks PP1 to PPn, which are all formed in the same configuration. Of these memory blocks, only the memory blocks PP1 and PPn are shown in the figure.

Each of the memory blocks have eight data lines, only one of which is selected by a first column switch (described later) during the read/write operation to be connected to a corresponding common data line $CD_0$-P for the memory block.

Next, we will explain about the configuration of the memory block by taking the memory block PP1 as an example. The memory block PP1 consists of memory cells of stacked gate structure each with a control gate and a floating gate (nonvolatile memory cells ... MOSFETs Q1-1 to Q1-4, Q1-5 to Q1-8, ...), word lines W1, W2, ..., Wn-1, Wn, and data lines D11 to D18. These memory cells have the same configuration as those in the EPROM of FIG. 1, except that the erase operation is performed by utilizing the tunnel phenomenon produced between the floating gate and the source or drain connected to the source line.

In this memory block, the memory cells arranged on the same row Q1-1 to Q1-4 (Q1-5 to Q1-8) have their control gates connected to the associated word line W1 (W2) and the memory cells arranged on the same column Q1-1, Q1-5 (Q1-4, Q1-8) have their drains connected to the associated data line D11 (D18). The source of each memory cell is connected to the source line. In this example, the common source line CS is connected to a unit common source control circuit CSCCi (i=1 to n) provided for each memory block. That is, in this example the common source control circuit CSCC shown in FIG. 4 has a plurality of unit common source control circuits. There is a one-to-one correspondence between the memory block and the associated unit common source control circuit. Hence, there are n unit common source control circuits CSCCi (i=1 to n) for one memory cell array.

In this example, the common source control circuit CSCC is given the output signal of a second column address decoder C-DEC$_2$ (described later) to select, from among n unit common source control circuits CSCCi (i=1 to n), only one unit common source control circuit. The selected unit common source control circuit then gives to the common source line CS connected thereto the circuit's ground potential Vss for the read/write operation and the high-level voltage Vpp for the erase operation. That is, a desired unit common source control circuit representing one memory block is selected from each memory cell array. As a result, one memory block is selected from each of the memory cell arrays, and the common source line CS for the selected memory block is applied with the ground potential Vss during the read/write operation and with the high-level voltage Vpp during the erase operation.

In other words, in this example of EEPROM having eight memory cell arrays, eight memory blocks are selected at one time. The common source lines CS for these selected memory blocks are applied with the ground potential Vss from the associated unit common source control circuits during the read/write operation and with the high-level voltage Vpp during the erase operation. The unit common source control circuits all have similar configurations, and each consists of an n-channel MOSFET Q10 that applies the ground potential Vss of the circuit to the common source line CS and a p-channel MOSFET Q17 that is switched by an erase control circuit ERC (described later) to apply the erase high-level voltage Vpp to the common source line CS.

The remaining memory blocks not shown also have the same configuration as that of the memory block shown. In the figure, M in the memory block represents a memory cell described above. In this example, the sources of the memory cells forming one memory block are connected to one and the same common source line CS. Thus, data is erased one memory block at a time. In other words, when the whole EEPROM is considered, it is possible to erase data eight memory blocks at a time in this example.

To erase data from a part of each of the plural memory blocks making up the memory cell array MA0, the common source line CS may be divided into two or more, each of which is provided with the switch MOSFETs Q10 and Q17. When it is desired to erase data from the entire memory cells of MA0 at a time, the common source lines CS of the memory blocks in the memory cell array MA0 may be tied to a single common source line, which is provided with one set of MOSFETs Q10 and Q17.

To allow reading and writing of data in units of eight bits, there are provided memory cell arrays MA1 to MA7 similar in configuration to the memory cell array MA0, as shown in FIG. 4. The EEPROM has a total of eight memory cell arrays, of which only one memory cell array MA0 is representatively shown in FIG. 8.

The data lines D11 to D18, ..., Dn1 to Dn8 that make up one memory cell array MA0 are connected to a common data line CD0 through column selection switch MOSFETs Q7-1 the Q7-8, ..., Qn-1 to Qn-8, Q7 to Qn that receive selection signals generated by the column address decoder C-DEC.

The column selection switch MOSFET in this example is formed of two stages. That is, the first column switch is formed of column selection switch MOSFETs Q7-1 to Q7-8, ..., Qn-1 to Qn-8, while the second column switch is formed of column selection switch MOSFETs Q7 to Qn. The first column switch can be deemed as consisting of a plurality of unit first column switches. The unit first column switches have one-to-one correspondence with memory blocks, and unit first column switch correspond to the memory block PP1 (PPn) is composed of MOSFETs Q7-1 to Q7-8 (Qn-1 to Qn-8). The unit first column switches for the associated memory block PP1 (PPn) connect one of the eight data lines in the memory block to a memory block common data line CD$_0$-P1 (CD$_0$-Pn) during the read/write operation. The second column switches connect to the common data line CD$_0$ one of the memory block common data lines CD$_0$-P1 to CD$_0$-Pn, each representing its associated memory block. In other words, the first column switch selects n data lines, of which only one data line is selected by the second column switch. For this purpose, the column address buffer/decoder CADB·DEC is comprised of two column address buffer/decoders CADB·DEC1 and CADB·DEC2. The first column address buffer/decoder CADB·DEC1 generates complement address signals for a part of the Y-address signal AY (in this example three bits) and decodes them for read/write operation. An eight-bit output signal formed by the decoding operation are commonly fed to the unit first column switches to turn on one column switch MOSFET (say, Q7-1 to Qn-1), thereby selecting one data line from each memory block and connecting them to the memory block common data lines CD$_0$-P1 to CD$_0$-Pn.

The remaining address bits of the Y-address signal AY are supplied to the second column address buffer/decoder CADB·DEC2. The second column address buffer/decoder CADB·DEC2 generates complement address signals from the remaining address bits and decodes them. The signal produced by the decoding is supplied to the second column switch to turn on one of the column switch MOSFETs Q7 to Qn that form the second column switch. In this way, during the read/write operation, the data line specified by the address signal AY is selected and connected to the common data line CD$_0$.

The common data line, as shown in FIG. 4, is provided for each memory cell array. The common data line CD$_0$ is connected with the output node of the data input buffer DIB$_0$, which receives the write data fed from the external terminal I/O$_0$. Similarly, for each of other memory cell arrays MA1 to MA7, the same column selection switch MOSFETs as those described above are provided and are given selection signals that were generated by the column address buffer/ decoders CADB·DEC. In this way, one bit is selected from each of the memory cell arrays MA0 to MA7, allowing the data to be entered or retrieved 8 bits at a time. It is also possible to provide a separate column address buffer/decoder for each memory cell array. In this example of FIG. 8, the row address buffer/decoder RADB·DEC is common for all eight memory cell arrays MA0 to MA7.

Connected, through a switch MOSFET Q16, to the common data line CD$_0$ that is provided for the memory cell array MA0 is the input node of a first stage amplifier circuit PA$_0$, which is detailed in the following. The first stage amplifier circuit PA$_0$ forms the input circuit of a sense amplifier SA$_0$. The SAP$_0$ shown in FIG. 4 includes the sense amplifier SA$_0$, the first stage amplifier circuit PA$_0$ and the MOSFET Q16.

In FIG. 8, the common data line CD$_0$ is connected with the source of an n-channel type amplifier MOSFET Q11 through the MOSFET Q16. The MOSFET Q16 is turned on by the read control signal sc going high (Vcc). Between the drain of the amplifier MOSFET Q11 and the source voltage terminal Vcc is connected a p-channel type load MOSFET Q12, which has its gate applied with the circuit's ground potential Vss. The load MOSFET Q12 applies a precharge current to the common data line $CD_0$ for data reading.

To enhance the sensitivity (mutual conductance) of the amplifier MOSFET Q11, the voltage of the common data line $CD_0$ is supplied, through the switch MOSFET Q16, to the gate of the drive MOSFET Q13. The drive MOSFET Q13 forms the input of an inversion amplifier circuit made up of the n-channel type drive MOSFET Q13 and a p-channel type load MOSFET Q14. The output voltage of the inversion amplifier circuit is supplied to the gate of the amplifier MOSFET Q11. Further, to minimize unwanted current consumption by the sense amplifier $SAP_0$ during non-activated period, an n-channel MOSFET Q15 is provided between the gate of the amplifier MOSFET Q11 and the circuit's ground potential point Vss. The n-channel MOSFET Q15 and the p-channel MOSFET Q14 have their gates applied commonly with a sense amplifier operation timing signal $\overline{sc}$. The operation timing signal $\overline{sc}$ is inverted in phase to form the read control signal sc.

When the memory cell is to be read, the sense amplifier operation timing signal $\overline{sc}$ is held low (Vss) to turn the MOSFET Q14 on and the MOSFET Q15 off. The memory cell is written, according to the write data, either with a high threshold voltage or a low threshold voltage which is higher or lower than the read selection level for the word line.

During the read operation, when the memory cell selected by the row address decoder R-DEC and the column address decoder C-DEC, i.e., the memory cell specified by the X-address signal AX and the Y-address signal AY, is off even when the word line has a read selection level (almost equal to the source voltage Vcc), the potential of the common data line $CD_0$ is raised to a high level with relatively low potential by the current supplied through the MOSFETs Q11 and Q12. On the other hand, when the selected memory cell is turned on by the read selection level (almost Vcc) of the word line, the common data line $CD_0$ is lowered to a low level with relatively high potential.

In this case, the high level of the common data line $CD_0$ is restricted to a relatively low potential by supplying the relatively low output voltage of the inversion amplifier circuit (Q13, Q14)—that receives this high level of potential—to the gate of the MOSFET Q11. On the other hand, the low level of the common data line $CD_0$ is limited to a relatively high potential by supplying the relatively high voltage of the inversion amplifier circuit (Q13, Q14)—that receives this low level of potential—to the gate of the MOSFET Q11. In this way, by limiting the potential difference between the high level and the low level in the common data line $CD_0$, it is possible to increase the read operation speed even when the common data line $CD_0$ is coupled with a stray capacitance that will limit the signal change speed. That is, when data is read out successively from one memory cell after another, it is possible with this invention to shorten the time it takes for the potential of the common data line $CD_0$ to change from one level to another. For such a high speed read operation, the conductance of the load MOSFET Q12 is set relatively high in this embodiment.

The amplifier MOSFET Q11 amplifies the gate-grounded type source input, and the output signal of the MOSFET Q11 is fed to the input node of the sense amplifier $SA_0$, which is made up of the CMOS invertor circuit. The output signal of the sense amplifier $SA_0$ is amplified by the data output buffer $DOB_0$ and output from the external output terminal $I/O_0$. The write data entered from the external terminal $I/O_0$ is sent to the common data line $CD_0$ through the data input buffer $DIB_0$.

As is seen from FIG. 4, each of other memory cell arrays MA1 to MA7 has, between the common data line $CD_1$ to $CD_7$ and the external terminal $I/O_1$ to $I/O_7$, circuits similar to those for the memory cell array MA0—a sense amplifier $SAP_1$ to $SAP_7$ consisting of an input circuit $PA_1$ to $PA_7$ and a sense amplifier $SA_1$ to $SA_7$, a read circuit made up of a data output buffer $DOB_1$ to $DOB_7$, and a write circuit made up of a data input buffer $DIB_1$ to $DIB_7$.

RESH shown in FIG. 8 is a selection circuit which receives signals from the second column address buffer/decoder CADB·DEC2 and, during the read/write operation, supplies the read/write signal rw to one of the unit common source control circuits CSCC1 to CSCCn. During the erase operation, the selection circuit RESH supplies the output signal of the erase control circuit ERC (described later) to one of the unit common source control circuit CSCC1 to CSCCn. That is, for the read/write operation, the high-level (Vcc) read/write signal rw generated by the timing control circuit CTC is fed to the selection circuit RESH, which selects and outputs one of read/write signals rw1 to rwn according to the address signal from the column address buffer/decoder CADB·DEC2. The selected read/write signal is output to the unit common source control circuit CSCCi that corresponds to the memory block PPi which has a data line to be connected to the common data line $CD_0$. For example, during the read/write operation, when the column switch MOSFET Q7 (Qn) is turned on by the address signal AY, the read/write signal rw is output from the selection circuit RESH as the read/write signal rw1 (rwn). This supplies a high-level (Vcc) read/write signal to the unit common source control circuit CSCC1 (CSCCn) that corresponds to the memory block PP1 (PPn) which has the memory cell to be read from or written into. And the MOSFET Q10 in the common source control circuit CSCC1 (CSCCn) is turned on. As a result, the circuit ground potential Vss is supplied to the common source line CS in the memory block PP1 (PPn) which has the memory cell to be read from or written into, thus permitting the reading or writing of the memory cell to be performed.

For the erase operation, an address signal specifying the memory block to be erased is fed to the EEPROM. The address signal is supplied to the second column address buffer/decoder CADB·DEC2. The output of the second column address buffer/decoder CADB·DEC2 is, as mentioned earlier, supplied to the second column switch and the selection circuit RESH. The output signal (erase signal) of the erase control circuit ERC is output from the selection circuit RESH as one of internal erase signals er1 to ern according to the output signal of the second column address buffer/decoder CADB·DEC2 already supplied to the selection circuit RESH. In this case also, the internal erase signal is supplied to the unit common source control circuit that corresponds to the memory block to be erased, the one to be connected to the common data line $CD_0$. As detailed later, the erase signal is held low (Vss) when the erase operation starts and then changes to high level (Vpp) when the data contained in the memory cell has been erased. For example, when an address signal (erase address signal) specifying the memory block PP1 (PPn) is supplied to the EEPROM during the erase operation, the column switch MOSFET Q7 (Qn) forming the second column switch is turned on and at the same time the erase signal is output from the selection circuit RESH as the internal erase signal erl (ern). The internal erase signal erl (ern) is supplied to the unit common source control circuit CSCC1 (CSCCn) for the memory block PP1 (PPn), to turn on the MOSFET Q17 in the unit common source control circuit CSCC1 (CSCCn) when the erase operation is started. As a result, the erase high-level voltage Vpp is supplied to the common source line CS for the memory block PP1 (PPn), erasing data from the memory cells in that memory block.

This kind of selection circuit RESH can be formed, for example, by using two multiplexers of the same configuration as that of the second column switch, supplying the read/write signal rw to the input side of one multiplexer, and connecting its output side to each unit common source control circuit. Similarly, the input side of the other multiplexer is supplied with the output of the erase control circuit ERC, with the output side connected to each common source control circuit. The selection circuit RESH may be provided with a level conversion circuit that changes the level of the output signal of the second column decoder $DEC_2$, in order to control the switching of the second multiplexer. This is because the erase signal the second multiplexer transfers is high-level voltage Vpp. The high-level voltage Vpp used in the level conversion circuit is not shown in FIG. 8.

The timing control circuit CTC in this example generates timing signals such as internal control signals ce, er, $\overline{sc}$, $\overline{we}$, RS, ro, wo according to the chip enable signal $\overline{CE}$, output enable signal $\overline{OE}$, program signal $\overline{PGM}$, erase signal $\overline{EE}$ and write/erase high-level voltage Vpp supplied to the external terminals $\overline{CE}$, $\overline{OE}$, $\overline{PGM}$, $\overline{EE}$ and Vpp. The timing control circuit CTC also supplies selectively the read low-level voltage Vcc or write high-level voltage Vpp to the address decoders R-DEC, C-DEC and the data input buffers $DIB_0$ to $DIB_7$. In FIG. 8, the line that selectively supplies the source voltage Vcc or the high-level voltage Vpp is shown as Vcc/Vpp. The erase control circuit ERC and each of the unit common source control circuits are supplied at their external terminals Vpp with high-level voltages. As with the voltage supplied from the line Vcc/Vpp, however, the erase control circuit ERC and the unit common source control circuits may be supplied with a voltage generated by the timing control circuit CTC. In this case, the high-level voltage Vpp needs to be supplied to these circuits when the erase mode is specified.

In this example, the line Vcc/Vpp is supplied with the high-level voltage Vpp from the timing control circuit CTC during the write operation and with the source voltage Vcc from the timing control circuit CTC during the read, verify and erase operations. When, with the write/erase high-level voltage Vpp (say 12 V) applied to the external terminal Vpp, the chip enable signal $\overline{CE}$ is held low (Vss), the output enable signal $\overline{OE}$ is held high (Vcc) and the program signal $\overline{PGM}$ is held low (Vss), the timing control circuit CTC decides that the write mode has been specified to the EEPROM, raising the internal signal ce to high level and supplying the high-level voltage Vpp to the line Vcc/Vpp. The address decoders R-DEC, C-DEC and the data input buffers $DIB_0$ and $DIB_7$ are then applied with the high-level voltage Vpp as their operation voltages. The voltage on the work line which is connected with the memory cell to be written into is set to the high-level voltage Vpp by the address decoder R-DEC. The data input buffer supplies the high-level voltage Vpp through the column switch MOSFET to the data line which is connected with the memory cell whose floating gate is to be injected with electrons. Then the channel saturating current flows into the memory cell, so that electrons accelerated by the strong electric field in the pinch-off region near the drain coupled to the data line become ionized producing so-called hot electrons with high energy. The voltage of the floating gate is determined by factors including the voltage of the control gate connected to the work line, the drain voltage, the capacitance between the substrate and the floating gate, and the capacitance between the floating gate and the control gate. The floating gate then attracts the hot electrons, making its potential negative. As a result, the memory cell is off even when the potential of the word line connected to the control gate is set to the source voltage (say 5 V), which is used for the read operation.

As to the memory cells that are not injected with electrons, the drain of the memory cell is applied with a low level of potential such that no hot electrons will be produced in the pinch-off region near the drain. Or its control gate is not applied with the high-level voltage Vpp.

When the chip enable signal $\overline{CE}$ is low (Vss), the output enable signal $\overline{OE}$ is low (Vss), the program signal $\overline{PGM}$ is high (Vcc) and the voltage applied to the external terminal Vpp is the write high-level voltage Vpp, then the timing control circuit CTC decides that the verify mode has been specified to the EEPROM. When the verify mode is set, the timing control circuit CTC holds the internal signal $\overline{sc}$ low (Vss) and the internal signal ce high (Vcc). In the verify mode, the address decoders R-DEC, C-DEC and the data input buffers $DIB_0$ to $DIB_7$ are applied with the source voltage Vcc through the line Vcc/Vpp. That is, their operation voltages are switched from the high-level voltage Vpp to the source voltage Vcc before being supplied to them.

When the chip enable signal $\overline{CE}$ is low (Vss), the output enable signal $\overline{OE}$ is low (Vss), the program signal $\overline{PGM}$ is high (Vcc) and the voltage applied to the external terminal Vpp is the read low-level voltage (equal to Vcc), then the timing control circuit CTC decides that the read mode has been specified for the EEPROM, setting the internal signal $\overline{sc}$ low and the internal signal ce high. Then the abovementioned read operation is carried out.

When the chip enable signal $\overline{CE}$ is low (Vss), the output enable signal $\overline{OE}$ is high (Vcc), the program signal $\overline{PGM}$ is high (Vcc) and the voltage applied to the external terminal Vpp is the high-level voltage Vpp, then the timing control circuit CTC decides that the erase mode has been specified for the EEPROM. With the erase mode set, the timing control circuit CTC makes the internal signals er and ce go high (Vcc) and the internal signal $\overline{sc}$ go low (Vcc). In response to the internal signal ce going high, an address signal specifying the memory block to be erased may be taken into the column address buffer/ decoder $CADB \cdot DEC_2$. In the erase mode, the erase control circuit ERC is activated to supply the high-level voltage from the external terminal Vpp to the common source line CS as the erase voltage Vpp. The charge stored in the floating gates of the memory cells, say Q1-1, is pulled into the source side by the tunnel phenomenon caused by the high-level voltage Vpp applied to the source (which actually acts as a drain). As a result the data in the memory cell is erased.

At this time the internal signal er causes the switch MOSFET Q18 provided to the common data line $CD_0$ to turn on, allowing the current flowing through the memory cell being erased to be transferred to the erase control circuit ERC through the data line and the column switch MOSFET. By performing the above current detection operation, the threshold voltage of the memory cells is monitored to control the amount of charge erased from the cells.

In this example, the data input buffers $DIB_0$ to $DIB_7$ and the at a output buffers $DOB_0$ to $DOB_7$ are controlled by the timing control circuit CTC. That is, when the read or verify mode is specified, the data output buffers $DOB_0$ to $DOB_7$ are activated by the control signal ro output from the timing control circuit CTC. On the other hand, the data input buffers $DIB_0$ to $DIB_7$ are activated by the control signal wo output from the timing control circuit CTC when the write mode is specified.

The data input buffers $DIB_0$ to $DIB_7$ include a data input circuit like the one shown in FIG. 2 (made up of the gate G3, invertor N6, MOSFETs Q28 to Q32 and MOSFET Q15). In this case, however, the MOSFETS Q29, Q30, Q32 and Q15 are supplied with voltage from the timing control circuit CTC through the line Vcc/Vpp. The internal write enable signal $\overline{we}$ is generated by the timing control circuit and held low when the write mode is specified.

Figure 16:
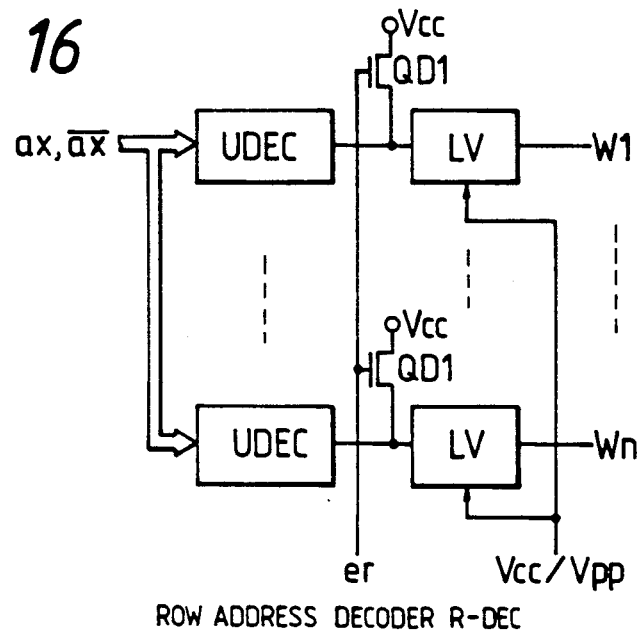
FIG. 16 is a block diagram showing one example of a row address decoder for the EEPROM.

One example of the row address decoder R-DEC is shown in FIG. 16. In the figure, LV represents a level conversion circuit of the same configuration as the level conversion circuit of FIG. 2 (made up of MOSFETs Q20 to Q23). The MOSFETs corresponding to the MOSFETs Q21, Q23, however, are applied with voltage through the line Vcc/Vpp. UDEC is a unit decoder, which is formed, for instance, of NAND circuits. In this example, according to the complement address signals ax, $\overline{ax}$, one of the unit decoders generates a low-level output signal while the remaining unit decoders produce high-level output signals. As will be understood from the foregoing description, the level conversion circuit LV receiving the low-level output signal transfers the voltage present at that time on the line Vcc/Vpp to the word line. Thus, during the write operation, a selection signal almost equal to the high-level voltage Vpp (12 V) is supplied to the word line. During the read operation or verify mode, a selection almost equal to the source voltage Vcc (5 V) is supplied to the word line. The unselected word lines are applied with low-level voltages (Vss).

A switch MOSFET QD1 is provided between the signal line that transfers the output signal of the unit decoder UDEC to the level conversion circuit LV and the source voltage Vcc. When the erase mode is specified, the timing control circuit CTC outputs a high-level (Vcc) erase signal (internal signal) er. This raises the signal lines connecting the unit decoders UDEC and the level conversion circuits LV to high level (Vcc), causing all the word lines to go low (Vss).

Figure 17:
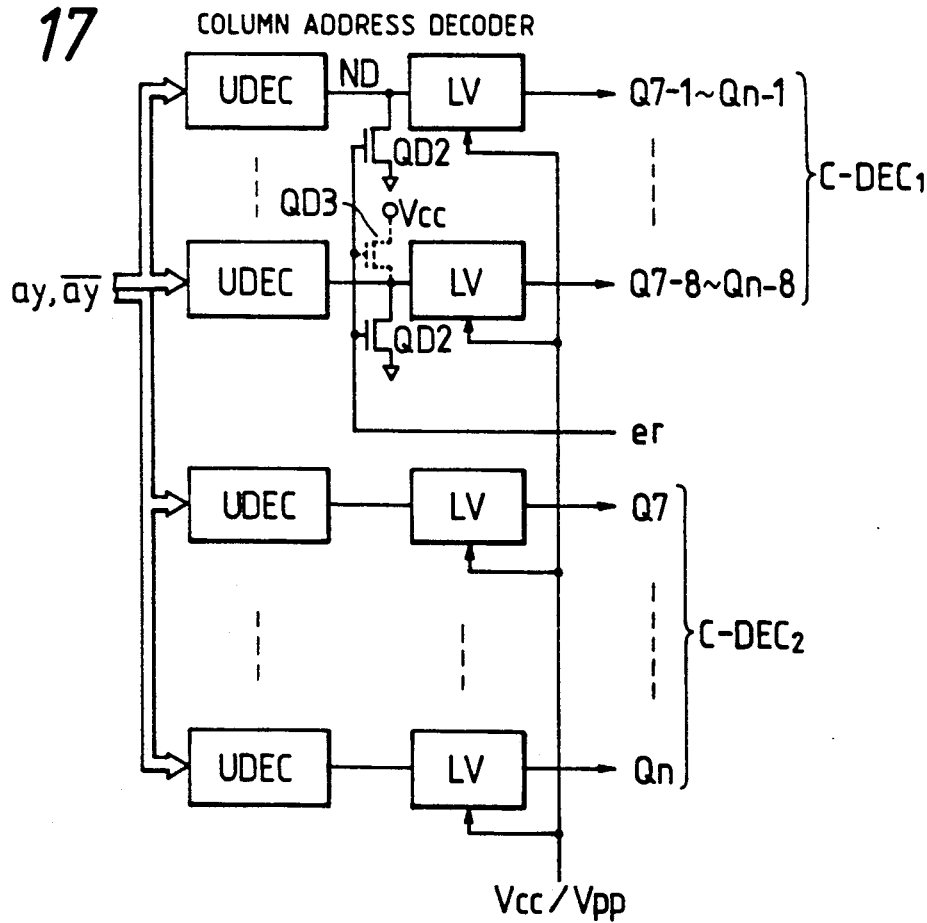
FIG. 17 is a block diagram showing one example of a column address decoder for the EEPROM.

FIG. 17 shows one example of the column address decoders $C-DEC_1$, $C-DEC_2$. In the figure, LV represents a level conversion circuit with the same configuration as the level conversion circuit LV of FIG. 16. UDEC is a unit decoder formed, for example, of NAND circuits. The unit decoders UDEC forming the first column address decoder $C-DEC_1$ receive a part of the complement address signals ay, $\overline{ay}$ and one of these unit decoders UDEC produces a low-level (Vss) output signal, with the remaining producing high-level (Vcc) output signals. As a result, the voltage present at that time on the line Vcc/Vpp is supplied to the gates of the column switch MOSFETs Q7-1 to Qn-1, ..., or Q7-8 to Qn-8. A plurality of unit decoders making up the second column address decoder $C-DEC_2$ receive the remainder of the complement address signals ay, $\overline{ay}$. Of the unit decoders UDEC making up the second column address decoder $C-DEC_2$, one specified by the remaining complement address signals generates a low-level (Vss) output signal and the remaining unit decoders UDEC produce high-level (Vcc) output signals. As a result, the voltage on the line Vcc/Vpp is fed to the gate of one of the column switch MOSFETs Q7 to Qn. Thus, the gates of the column switch MOSFETs Q7-1 to Qn-1, ..., or Q7-8 to Qn-8 as well as the gate of one of the column switch MOSFETs Q7 to Qn are supplied with the high-level voltage Vpp during the write mode and with the source voltage Vcc during the read and verify modes. The other column switch MOSFETs that are not selected are supplied at the gates with the voltage Vss.

A switch MOSFET QD2 is provided between the circuit's ground potential point Vss and the signal line connecting each unit decoder UDEC of the first column address decoder $C-DEC_1$ and each level conversion circuit LV. The erase signal er, as mentioned above, is raised to high level when the erase mode is specified. At this time, as mentioned above, the voltage on the line Vcc/Vpp is set to the source voltage Vcc, so that when the erase mode is specified, the source voltage Vcc is supplied to the gates of all the column switch MOSFETs Q7-1 to Qn-1, ..., and Q7-8 to Qn-8.

Figure 9:
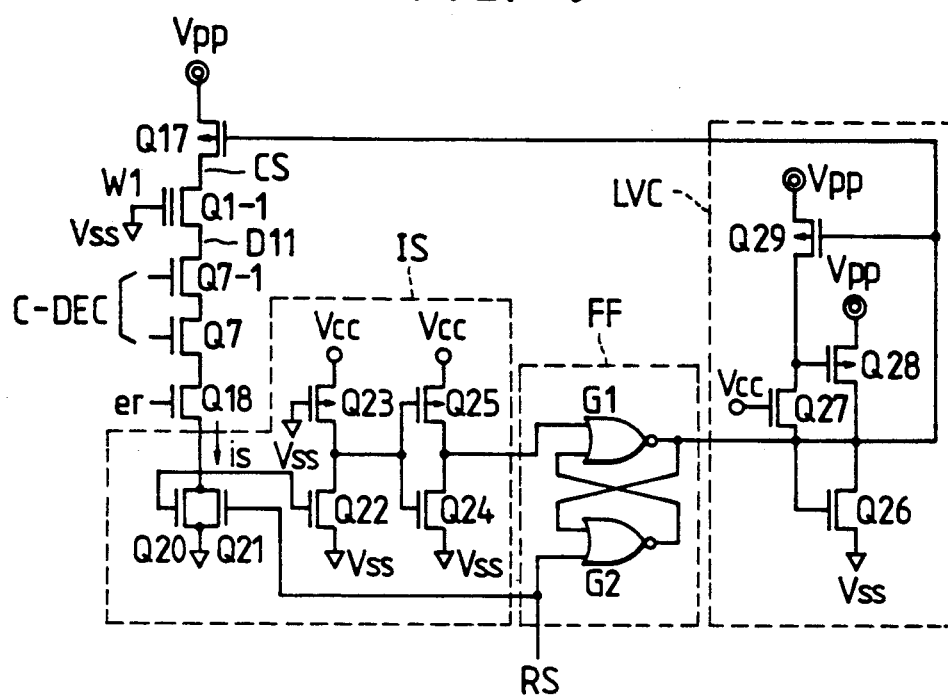
FIG. 9 is a circuit diagram showing one example of an erase control circuit used in the EEPROM of this invention.

FIG. 9 shows one example of the erase control circuit EREC. In this example the erase control circuit ERC is included in the common source control circuit CSCC of FIG. 4. For simplicity, we will describe an example case in which during the erase mode, a particular column switch MOSFET is turned on to connect one data line to the common data line. For this purpose, only the signal line which is denoted ND in FIG. 17 are provided with a switch MOSFET QD2 indicated by a solid line, while the remaining signal lines are connected with a MOSFET QD3 as indicated by a broken line. In this configuration, the source voltage Vcc is supplied to the gates of only the column switch MOSFETs Q7-8 to Qn-8 so that only these MOSFETs are turned on. At this time, as mentioned above, the second column address buffer/decoder CADB-DEC2 is supplied with the erase address signal that selects only one of column switch MOSFETs Q7 to Qn to be turned on. If, in this case, the erase address signal includes the address signal supplied to the first column address buffer/ decoder CADB-DEC1, then the MOSFETs QD2 and QD3 are not necessary.

In the example shown in FIG. 9, to control the amount of charge deleted from the memory cell, the current flowing through the memory cell Q1-1—from which the data is to be erased—is taken via a column selection circuit of the memory array MA0 which is made up of the data line D11, column switch MOSFETs Q7-1, Q7 and common data line CD0. The current is then supplied through the switch MOSFET Q18, which turns on during the erase mode, to the current detection circuit IS.

The current detection circuit IS comprises two invertor circuits: the first consists of a MOSFET Q20, which is configured as a diode, an n-channel type drive MOSFET Q22 that receives the drain voltage of the MOSFET Q20, and a p-channel type load MOSFET Q23; and the second is a CMOS invertor circuit that consists of an n-channel MOSFET Q24 and a p-channel MOSFET Q25, both receiving the output from the first invertor circuit. The MOSFET Q20, configured as a diode, transforms the current flowing through the memory cell Q1-1 into voltage. The converted voltage is then amplified by the first invertor circuit. The CMOS invertor circuit outputs a high or low level voltage depending on whether the received voltage from the first invertor representing the current flowing through the memory cell Q1-1 is higher or lower than a specified value, with the logic threshold voltage of the CMOS invertor circuit taken as a reference. The current-voltage converter MOSFET Q20 is connected in parallel with a reset MOSFET Q21.

In the figure, the column switch MOSFET is shown consisting of two stages—MOSFETs Q7 and Q7-1—but may be otherwise. During the erase operation, only the word line W1 connected to the control gate of the memory cell to be erased is applied with the ground potential Vss of the circuit (or negative voltage). For this purpose, an address counter is provided to the address decoder R-DEC of FIG. 16 and the outputs of the address counter are supplied to the gates of the switch MOSFETs QD1. The outputs of the address counter are made to go high successively in response to the erase signal er. In this configuration, the switch MOSFETs QD1 are made, for example, to turn on successively from the uppermost switch and downward during the erase mode. Or the row address signal AX may also be supplied to the EEPROM as the erase address signal. In the latter case, the MOSFET QD1 as shown in FIG. 16 is not required. The circuit configuration that turns on the column switches Q7-1, Q7 to monitor the threshold level in the memory cell being erased is already described.

The output signal of the current detection circuit is held by a latch circuit FF which consists of NOR gates G1, G2. The NOR gate G1 is supplied with the output signal of the current detection circuit IS, while the other NOR gate G2 and the gate of the reset MOSFET Q21 are supplied with a reset signal RS that triggers the erase operation.

The output signal of the latch circuit FF is entered to the level conversion circuit LVC where it is converted into a gate control signal for the MOSFET Q17 that supplies the erase voltage Vpp to the source line connected to the target memory cell Q1-1. The output signal of the latch circuit FF is at the level of the source voltage Vcc or 5 V. Thus it must be converted to the level of voltage Vpp to turn off the p-channel MOSFET Q17 that outputs the erase high-level voltage Vpp.

The level conversion circuit LVC is comprised of the following circuit elements. The output signal of the NOR gate G1 is supplied to the gate of the n-channel MOSFET Q26. A p-channel MOSFET Q28 is provided between the drain of the MOSFET Q26 and the high-level voltage Vpp. To switch between the n-channel MOSFET Q26 and the p-channel MOSFET Q28 to produce a level-converted output, the output signal of the NOR gate G1 is supplied to the gate of the p-channel MOSFET Q28 through an n-channel MOSFET Q27, which is always supplied at its gate with the source voltage Vcc. Between the gate of the p-channel MOSFET Q28 and the high-level voltage Vpp is connected a p-channel MOSFET Q29 that receives the level-converted output.

The operation of the level conversion circuit LVC in this example is as follows.

When the output signal of the NOR gate G1 is high (5 V), the n-channel MOSFET Q26 is turned on to hold its output at the low level ground potential Vss of the circuit. This causes the p-channel MOSFET Q29 to turn on, which in turn causes the p-channel MOSFET Q28 connected in series with the MOSFET Q26 to turn off. At this time, the MOSFET Q27 is supplied at its gate and source with 5 V and turned off to prevent a dc current from flowing between the MOSFET Q29 and the p-channel MOSFET forming the high level of the NOR gate G1. In this way, when the output signal of the NOR gate G1 is high about 5 V, the output of the level conversion circuit LVC goes low to the ground potential Vss. On the other hand when the output signal of the NOR gate G1 is at low level such as 0 V, the n-channel MOSFET Q26 is turned off. This low level signal is sent through the MOSFET Q27 to the gate of the MOSFET Q28 to turn on the p-channel MOSFET Q28. Thus, the output signal of the level conversion circuit LVC is raised to the high-level voltage Vpp. FIG. 9 does not show the selection circuit RESH for simplified description.

FIG. 10 shows the simplified cross-sectional view of a memory cell undergoing the erase operation. In the erase operation, the control gate CG of the memory cell is supplied with the ground potential Vss (or negative voltage). The source/drain SD connected to the source line is applied with the high-level voltage Vpp about 12 V. (Since the nonvolatile memory cell has a bidirectional characteristic, the source and the drain may switch to each other depending on the way the voltage is applied, so that they are denoted a source/drain SD.) Then, the electrons stored in the floating gate FG are pulled toward the source/drain SD side connected to the source line by the tunnel phenomenon caused by a high electric field acting between the control gate CG and the source/drain SD. In this way the erase operation is performed.

For the write operation, the other source/drain is connected to the data line and then the hot electrons mentioned above are generated to inject electrons into the floating gate FG. The method of manufacturing such non-volatile memory cells is described in the U.S. patent application Ser. No. 053,730 filed on May 26, 1987 now abandoned and its first continuation application Ser. No. 310,014 filed by this applicant on Feb. 13, 1989 now abandoned, its second continuation application Ser. No. 440,475 filed Nov. 21, 1989 now abandoned and its third continuation application Ser. No. 517,386 filed Apr. 30, 1990.

In FIG. 9, when the erase operation is carried out, the column address to select the memory cell Q1-1 for monitoring is specified and the corresponding column switch MOSFETs Q7-1, Q7 are turned on.

Then the reset signal RS is raised to high level to turn on the MOSFET Q21, causing the output signal of the current detection circuit IS to go low. The latch circuit FF is reset to raise its output signal to high level. The reset signal RS is a one-shot pulse, which is held high only temporarily.

The reset signal is formed by the timing control circuit CTC. For instance, it may be generated by using an AND circuit that receives the erase signal er at one of its two inputs and a delay circuit that delays the erase signal er, and by connecting the output of the delay circuit to the other input of the AND circuit to produce the reset signal RS from the AND circuit.

As the output signal of the latch circuit FF goes high (Vcc), the output signal of the level conversion circuit LVC goes low (Vss), turning on the p-channel MOSFET Q17 for erase operation. This initiates the erase operation as explained in FIG. 10 and the electrons in the floating gate FG are pulled toward the source/drain SD connected to the source line. As the electrons in the floating gate FG reduces as a result of the erase operation, the potential of the floating gate FG rises by the capacitance coupling between the source/drain SD connected to the source line and the floating gate FG and between the floating gate FG and the control gate CG, causing the channel current to flow as shown in the characteristic diagram of FIG. 11.

Figure 11:
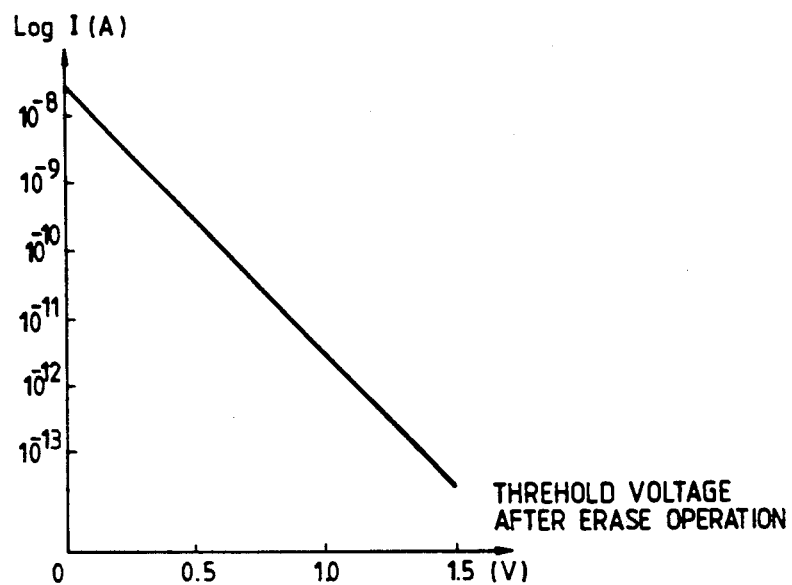
FIG. 11 is a characteristic diagram of the nonvolatile memory cell during the erase operation.
Figure 12:
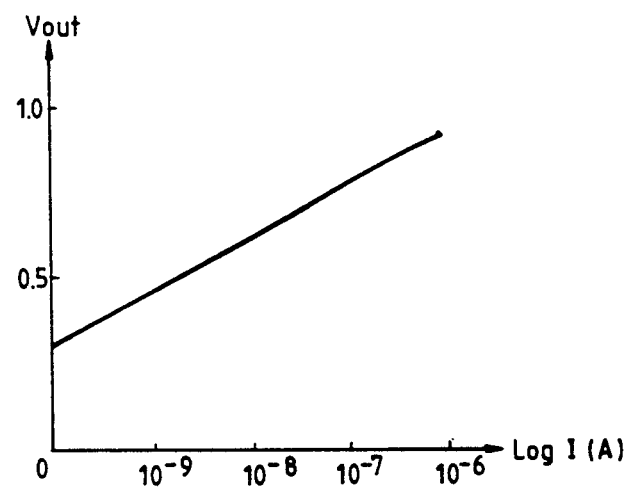
FIG. 12 is a current-voltage conversion diagram during the erase control.

FIG. 11 shows the relationship between the threshold voltage (V) and the channel current (I) after the erase operation. The channel current flows through the data line D11, column switch MOSFETs Q7-1, Q7, common data line $CD_0$ and switch MOSFET Q18 into the diode-configured MOSFET Q20. As a result, the potential of the commonly connected gate and drain increases with an increase in the current, as shown in the characteristic diagram of FIG. 12. FIG. 12 shows the relationship between the current (I) flowing through the diode-connected MOSFET Q20 and the voltage (V) produced by this current. This potential is amplified by the invertor circuit, which is made up of the MOSFETs Q22 and Q23, and then transferred to the CMOS invertor circuit that performs the voltage detection. The CMOS invertor circuit converts the amplified potential into a high- or low-level signal with its logic threshold voltage taken as a reference. That is, the current to be detected is checked by the invertor circuit that functions as an amplifier and by the CMOS invertor circuit. When the current reaches a specified level, the output of the CMOS invertor circuit switches from low level to high level, inverting the output of the latch circuit from high level to low level.

Upon receiving the low-level output from the latch circuit FF, which is produced as a result of the flip-flop action of the latch circuit FF, the level conversion circuit LVC generates the high-level voltage Vpp, turning off the p-channel MOSFET Q17 to stop the erase operation.

The amount of charge to be erased from the memory cell is so set that the memory cell will have a threshold voltage that causes the memory cell Q1-1 to turn on when its control gate CG is held at the selection level of 5 V and to turn off when the control gate CG is held at the non-selection level of 0 V. That is, the logic threshold voltage of the CMOS invertor, which determines the amount of charge to be erased from the memory cell, is set so that the erase operation will automatically stop when the threshold voltage of the memory cell reaches the above memory turn-on/turn-off level. This makes it possible to perform the read or write operation in the same way as in the EPROM, without having to add the address selection MOSFETs to the memory cells. In other words, when the threshold voltage of the memory cell Q1-1 becomes negative, the memory cell turns on even when the word line W1 is held at the non-selection level of 0 V, making the selection/deselection of the memory cell virtually impossible.

This is explained in more detail. The decoder shown in FIG. 16 is used as the row address decoder R-DEC, the decoder shown in FIG. 17 is used as the column address decoder C-DEC, and the unit common source control circuit is provided for each memory block, as shown in FIG. 8. When the erase mode is specified and the address signal specifying a memory block to be erased is supplied, the word lines W1 to Wn are each held at the circuit's ground potential Vss and the data lines D11 to D18, ..., Dn1 to Dn8 are each electrically connected to the corresponding memory block common data line $CD_0$-P1, ..., $CD_0$-Pn. When, for example, the memory block PP1 (PPn) is spedified by the erase address signal which specifies a memory block to be erased, the data lines D11 to D18 (Dn1 to Dn8) are electrically connected to the common data line $CD_0$, erasing the entire memory cells in the memory block PP1 (PPn) simultaneously. At this time, the current flows from the entire memory cells of the memory block PP1 (PPn) to the common data line $CD_0$ and then, through the MOSFET Q18, into the erase control circuit ERC. The amount of charge to be erased, which is preset by the erase control circuit ERC (in the above example, preset by the logic threshold voltage of the CMOS invertor circuit), is so set that when the memory cells are supplied at the control gates with the rear selection level (say, 5 V), they are turned on and that when they are supplied at the control gates with the non-selection level (say, the ground potential Vss of the circuit), they are turned off. It is also possible in the above example to determine the amount of charge to be erased from the memory cell array, by using the preset amount of charge erasure for the memory cell Q1-1 and the number of memory cells in the memory cell array. That is, by multiplying the preset amount of charge erasure for the memory cell Q1-1 with the number of memory cells, it is possible to determine the amount of charge to be erased for the memory cell array. The erase operation performed on a single memory cell causes a relatively small current to flow through the memory cell. Thus, to detect the current from a single memory cell, it is preferable to use the circuit example as shown in FIGS. 8, 11 and 17 rather than the above example.

In the example shown in FIG. 8, the memory cell array MA0 is provided with the MOSFET Q18 and the erase control circuit ERC. Such as erase control unit (MOSFET Q18 and the erase control circuit ERC) may be provided to each of the memory cell arrays MA0 to MA7. In this case, the amount of charge being erased is monitored for each memory cell array, so that an appropriate erase operation can be done individually for each memory cell array.

The erase control circuit ERC as shown in FIG. 8 may also be used commonly for each memory cell array MA0 to MA7. In this case, the amount of charge erased from the memory block in each memory cell array MA0 to MA7 is controlled according to the charge erase amount for the memory block in the memory cell array MA0. With this configuration, only one erase control circuit ERC need be provided for the EE- PROM and this contributes to reducing the size of the EEPROM chip.

Furthermore, it is possible to electrically connect all the common data lines $CD_0$ to $CD_7$ for respective memory cell arrays to the erase control circuit ERC of FIG. 8 during the erase mode. In this case, the signals rwl to rwn, erl to ern from the selection circuit RESH are supplied to the unit common source control circuit CSCCi corresponding to the memory block of each memory cell array MA0 to MA7. For example, the signals rwl (rwn) and erl (ern) are supplied to the unit common source control circuit CSCCl (CSCCn) that corresponds to the memory block PPl (PPn) in each memory cell array MA0 to MA7. This configuration minimizes the chip area of the EEPROM and at the same time increases the current value to be detected, to some extent, during the erase operation. This in turn simplifies the configuration of the erase control circuit ERC.

With this invention, the memory cells can be prevented from having a negative threshold voltage as a result of the erase operation, which in turn makes it possible to form a memory cell with one transistor and thereby increase the memory capacity of the flash type EEPROM.

While, in the foregoing descriptions using FIG. 8, the erase mode is specified to the flash type EEPROM by the combination of the program signal $\overline{PGM}$, chip enable signal $\overline{CE}$, external potential Vpp and output enable signal $\overline{OE}$, it is possible to specify the erase mode to the EEPROM by using the combination of the erase signal $\overline{EE}$ supplied to the external terminal $\overline{EE}$, external potential Vpp and chip enable signal $\overline{CE}$. FIG. 8 shows the external terminals for $\overline{PGM}$, $\overline{OE}$, $\overline{CE}$, Vpp and $\overline{EE}$. When the former combination of signals ($\overline{PGM}$, $\overline{CE}$, Vpp and $\overline{OE}$) is used to specify the erase mode, the external terminal $\overline{EE}$ need not be provided.

In various examples described above by referring to FIG. 8 (flash type EEPROM), the read, write and erase operations can be performed in ways shown in FIG. 15, as in the case of the previous example described by referring to FIG. 5. In cases where the erase mode is specified by using the potentials applied to the erase signal $\overline{EE}$, chip enable signal $\overline{CE}$ and external terminal Vpp, when the erase mode is specified from the outside of the flash type EEPROM and persists for an extended duration, the internal circuit of the EEPROM automatically ends the erase mode. This applies to various examples using FIG. 8 in addition to the example of FIG. 5 described by referring to FIG. 1(A) to 1(C). That is, a signal similar to the erase signal er shown in FIG. 7(C) is considered to be supplied to the gate of the MOSFET Q17 from the erase control circuit ERC during the erase operation. In the examples associated with FIG. 8, however, the duration in which the erase signal corresponding to the erase signal er of FIG. 7(C) is held low is different from that of the example of FIG. 5 but is determined from the result of monitoring on the memory cell being erased. In these cases also, the virtual erase operation is ended irrespective of the external erase mode specification dictated from the outside of the EEPROM. Therefore, as in the example shown in FIG. 5, the characteristic of the memory cells can be protected against deterioration that would result when erroneous setting is made to the read/write/ erase control circuit RWEC.

The features and advantages of the above-mentioned various embodiments may be summarized as follows.

(1) In the nonvolatile memory device which has control gates and floating gates and which performs the write operation by injecting electrical charges into the floating gates or, in addition to the write operation, performs the erase operation by discharging the electric charges from the floating gates, a timer circuit is provided to limit the duration of the write operation and/or the erase operation to the preset time. This makes it possible to limit to within the specified value the internal write operation time and erase operation-time regardless of the external control signals, which in turn prevents memory cell characteristic deterioration that would otherwise occur as a result of excessively long write or erase operation.

(2) Because of the above feature (1), a highly reliable nonvolatile memory device can be obtained. The above function to prevent excess writing or erasing is particularly important to the EPROMs that are built into microcomputers because they cannot be replaced when failed.

(3) The switch MOSFET that applies the erase voltage to the source line connected to the non-volatile memory cell—which has a stacked gate structure with a floating gate—is controlled by utilizing the electric characteristic of the nonvolatile memory cell being erased, i.e., monitoring the current that flows through the memory cell as a result of the erase operation. This makes it possible to control the threshold voltage of the memory cell to be erased.

(4) Because of the above feature (3), the memory cell can be formed by one transistor, so that the memory capacity of the EEPROM can be increased.

In the above, the invention has been described in detail in conjunction with the preferred embodiments. It should be noted, however, that the invention is not limited to these embodiments alone and various modifications may be made without departing from the spirit and scope of the invention. For instance, the timer circuit, which employs a delay circuit as shown in FIG. 2, may be changed to the one that consists of an oscillation circuit and a counter that counts the pulses to produce a time signal defining a specified duration of time. In this case, the oscillation circuit and the counter, which counts the output pulses of the oscillation circuit in response to the low-level internal write enable signal $\overline{we}$ as shown in FIG. 2, are provided in the nonvolatile memory. The counter may be reset by the internal write enable signal $\overline{we}$ going high. The high-level output of the counter, instead of the output of the inversion delay circuit DL, is supplied to the gate G1 a specified period after the internal write enable signal $\overline{we}$ is held low. The nonvolatile semiconductor memory cells may be FLOTOX type transistors, which utilize the tunnel effect also in the write operation, or MNOS (metal nitride oxide semiconductor) type transistors as well as the stacked gate type MOS transistors used in the EPROM.

In the flash type EEPROM to which this invention is applied, the memory cells may be the FLOTOX type nonvolatile memory cell that utilizes the tunnel effect also in the write operation, in addition to the tacked gate type MOS transistors. It is also possible to provide dummy memory cells in addition to the memory cell array and monitor the amount of charge in the dummy memory cells during the erase operation by the circuit as shown in FIG. 8 to control the erase operation on the memory cells which form the memory cell array. This eliminates the column selection process during the erase operation.

The current detection circuit as shown in FIG. 8 may have a variety of other configurations for the latch circuit and the level conversion circuit. For instance, the current-voltage conversion circuit that converts the current flowing through the memory cell into a voltage signal may consist of a plurality of diode-configured MOSFETs connected in series. In stead of the diode-configured MOSFET Q20 as shown in FIG. 9, a resistor element such as that formed of high-resistance polysilicon layers may be used.

Figure 13:
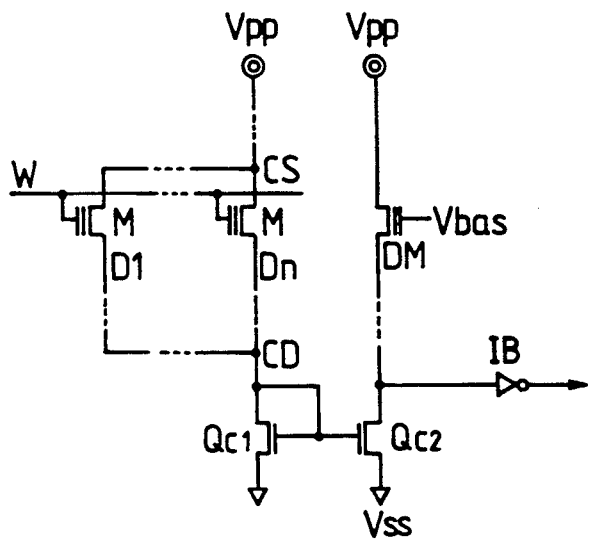
FIG. 13 is a circuit diagram showing an EEPROM as a further embodiment of this invention.

FIG. 13 shows a further example of the flash type EEPROM of FIG. 18. In the figure, M represents a memory cell and DM a dummy memory cell for current detection. CS represents a source line, D1 to Dn data lines, CD a common data line, and W a word line. Qc1 and Qc2 are MOSFETs that form a current mirror. Though not shown in the figure, column switches as mentioned earlier are provided between each data line D1 to Dn and the common data line CD. The common source line CS is connected with MOSFETs like the above-mentioned MOSFETs Q17, Q10. The gate of the MOSFET that corresponds to the MOSFET Q17 is supplied with the output of the buffer IB. The gate of the dummy memory cell DM is supplied with a specified bias voltage Vbas so that a current according to the desired amount of charge to be erased will flow through the dummy memory cell DM. When the data in the memory cells M forming the memory cell array is erased, the output voltage of the buffer IB changes according to the difference between the current flowing through the MOSFET Qc1 and the current flowing through the MOSFET Qc2. This makes it possible to control the amount of charge erased from the memory cells M. Like the previous examples, this example also performs the column switch selection operation during the erase operation. The dummy memory cell DM is protected from being erased.

In each of the above examples, the high-level voltage Vpp is supplied from outside to the external terminal Vpp of the nonvolatile memory. Alternatively, a step-up circuit may be provided in the nonvolatile memory to raise the source voltage Vcc to the high-level voltage Vpp whereby the write/erase high-voltage Vpp may be formed from the source voltage Vcc by the internal step-up circuit. Also, the external control signals supplied to the nonvolatile memory may take various other forms.

Many variations are possible for the circuit configurations of the memory arrays forming the EEPROM and for the associated circuits. This also applies to the selection circuit RESH.

Furthermore, all the memory cell arrays MA0 to MA7 may be erased at one time. Or the erase operation on the data in memory cells may be carried out one data line at a time. In this case, the unit common source control circuit may be provided for each data line.

The EPROM and EEPROM may be those built into digital semiconductor IC devices such as microcomputers.

This invention has wide applications, including nonvolatile memory cells of stacked gate structure as used in the EPROM and nonvolatile semiconductor memory devices that use the FLOTOX type memory cells.

The advantage of a typical embodiment of this invention may be summarized as follows.

In a nonvolatile memory device which has control gates and floating gates and which performs the write operation by injecting electric charges into the floating gate or, in addition to the write operation, performs the erase operation by discharging the electric charges from the floating gate, a timer circuit is provided to limit the write operation time and/or the erase operation time to a time setting. This makes it possible for the nonvolatile memory to internally set the write operation time and the erase operation time to within a specified value irrespective of the external control signal supplied from outside the nonvolatile memory. Thus, deterioration of the memory cell characteristics as caused by excessive writing or erasing can be prevented. Furthermore, it is possible to control the threshold voltage of the nonvolatile memory cell being erased by utilizing the electrical characteristic of the memory cell—i.e., monitoring the current flowing through the memory cell as a result of the erase operation—and by controlling, according to the amount of the monitored current, the switch MOSFET that applies the erase voltage to the source line connected to the nonvolatile memory cell which is of a stacked gate structure with the floating gate.

What is claimed is:

1. A nonvolatile semiconductor memory device comprising:
   a plurality of data lines;
   a plurality of word lines;
   nonvolatile memory cells each of which is connected to one of the data lines and to one of the word lines, and each of which consists essentially of a memory transistor that holds electric charges according to a voltage supplied, wherein the memory transistor consists essentially of a floating gate, a control gate and two electrodes;
   selection means connected to the data lines and to the word lines and for selecting predetermined ones of said nonvolatile memory cells;
   erasing means for erasing data stored in the nonvolatile memory cells;
   external terminals;
   writing means connected to the external terminals and to the nonvolatile memory cells, the writing means including means to supply a writing voltage to predetermined nonvolatile memory cells in response to signals supplied through the external terminals; and
   control means connected to the writing means and including a timing control circuit for indicating a predetermined time, the control means including means to permit the writing means to supply the writing voltage to the predetermined nonvolatile memory cells during a period defined by the predetermined time.

2. A nonvolatile semiconductor memory device as set forth in claim 1, wherein the timing control circuit is connected to the writing means.

3. A nonvolatile semiconductor memory device as set forth in claim 1, wherein the timing control circuit comprises a delay feedback circuit formed in said control means.

4. A nonvolatile semiconductor memory device comprising:
   a nonvolatile memory cell which stores data and which consists essentially of a memory transistor whose threshold voltage changes when applied with an erase voltage, wherein the memory transistor consists essentially of a floating gate, a control gate and at least two electrodes;

an erasing means for applying the erase voltage to the memory transistor; and a means for detecting a current flowing through the memory transistor when the erasing means applies the erase voltage to the memory transistor.

5. A nonvolatile semiconductor memory device as set forth in claim 4, further comprising:

a control means connected to the detecting means and the erasing means, the control means including means to control the operation of the erasing means according to the output of the detecting means.

6. A nonvolatile semiconductor memory device as set forth in claim 5, further comprising:

a plurality of nonvolatile memory cells each consisting essentially of a memory transistor whose threshold voltage changes when applied with the erase voltage, wherein the memory transistor consists essentially of a floating gate, a control gate and at least two electrodes, wherein the detecting means includes means for detecting total current flowing through the memory transistors when the erasing means applies the erase voltage to the memory transistors.

7. A nonvolatile semiconductor memory device as set forth in claim 6, wherein one of said two electrodes is a source electrode and the other of said two electrodes is a drain electrode.

8. A nonvolatile semiconductor memory device as set forth in claim 7, wherein the other electrode of the memory transistor is connected to one of the data lines and the control gate of the memory transistor is connected to one of the word lines.

9. A nonvolatile semiconductor memory device comprising:

a plurality of data lines;

a plurality of word lines;

nonvolatile memory cells each of which is connected to one of the data lines and to one of the word lines and each of which includes a memory transistor which consists essentially of a floating gate, a control gate and at least two electrodes and whose threshold voltage changes according to a voltage supplied, wherein each of the nonvolatile memory cells does not need an isolation transistor to select a nonvolatile memory cell from the nonvolatile memory cells;

selection means connected to the data lines and to the word lines and for selecting nonvolatile memory cells;

erasing means connected to the nonvolatile memory cells, the erasing means being adapted to supply an erasing voltage to predetermined nonvolatile memory cells;

detection means for detecting a current flowing through the predetermined nonvolatile memory cells when the erasing means applies the erase voltage to the predetermined nonvolatile memory cells; and control means for prohibiting the erasing voltage from being supplied to the nonvolatile memory cells in response to an output from the detection means.

10. A nonvolatile semiconductor memory device comprising a memory cell array including a plurality of data lines, a plurality of word lines and a plurality of nonvolatile memory cells which are arranged in a matrix and each of which is connected to one of the data lines and to one of the word lines, and selection means connected to the data lines and to word lines for selecting nonvolatile memory cells, the nonvolatile memory cells each consisting essentially of a memory transistor which consists essentially of a control gate, a floating gate and two electrodes, wherein a write operation is performed by injecting electric charges into the floating gate of the memory transistor and an erase operation is performed by pulling the electric charges from the floating gate by an erasing means, said memory device comprising:

a timer means; and a means for limiting the write operation time to a time setting of the timer means.

11. A nonvolatile semiconductor memory device as set forth in claim 10, wherein data is written into the memory transistor by avalanche-injecting electric charges from one of the two electrodes into the floating gate and data is erased by pulling the electric charges from the floating gate to the other of said two electrodes by a tunnel phenomenon.

12. A nonvolatile semiconductor memory device comprising a memory cell array including a plurality of data lines, a plurality of word lines and a plurality of nonvolatile memory cells which are arranged in a matrix and each of which is connected to one of the data lines and to one of the word lines, and selection means connected to the data lines and to the word lines and for selecting nonvolatile memory cells, the nonvolatile memory cells each consisting essentially of a memory transistor which consists essentially of a control gate, a floating gate and two electrodes, wherein write operation is performed by injecting electric charges into the floating gate of the memory transistor, and the erase operation is performed by pulling the electric charges from the floating gate by erasing means, the memory device comprising:

a timer means; and a means for limiting at least one of the write operation time and the erase operation time to a time setting of the timer means.

13. A nonvolatile semiconductor memory device as set forth in claim 12, wherein data is written into the memory transistor by avalanche-injecting electric charges from one of the two electrodes into the floating gate and data is erased by pulling the electric charges from the floating gate to the other of said two electrodes by a tunnel phenomenon.

14. A nonvolatile semiconductor memory device comprising:

a plurality of data lines;

a plurality of word lines;

a plurality of nonvolatile memory cells each of which is connected to one of the data lines and to one of the word lines, each of which stores data and each of which consists essentially of a memory transistor having a floating gate, a control gate and at least two electrodes;

selection means connected to the data lines and to word lines and for selecting nonvolatile memory cells;

source lines to which one of the two electrodes of the nonvolatile memory cells are connected;

a switch means for applying an erase voltage to the source lines; and a detecting means for turning off the switch means in accordance with detecting a predetermined current that flows through at least those of the nonvolatile memory cells from which retained data is being erased.

15. A nonvolatile semiconductor memory device as set forth in claim 14, wherein said switch means includes a switch MOSFET.

16. A nonvolatile semiconductor memory device as set forth in claim 15, wherein the memory transistor includes a first electrode, and a second electrode connected to one of said source lines.

17. A nonvolatile semiconductor memory device as set forth in claim 16, wherein the first electrode of the memory transistor is connected to one of the data lines and the control gate of the memory transistor is connected to one of the word lines.

18. A nonvolatile semiconductor memory device comprising:
   a plurality of data lines;
   a plurality of word lines;
   a plurality of nonvolatile memory cells each of which is connected to one of the data lines and to one of the word lines, each of which stores data and each of which consists essentially of a memory transistor having a floating gate, a control gate and at least two electrodes;
   selection means connected to the data lines and to word lines and for selecting nonvolatile memory cells;
   source lines to which one of the two electrodes of the nonvolatile memory cells are connected;
   a switch means for applying an erase voltage to the source lines; and
   a detecting means for turning off the switch means in accordance with detecting a predetermined current that flows through at least those of the nonvolatile memory cells from which retained data is being erased,
   wherein the detecting means includes:
      a current detection circuit for detecting a current flowing through the nonvolatile memory cells;
      a latch circuit for retaining a detection signal from the current detection circuit; and
      a level conversion circuit for converting the output signal of the latch circuit to other levels.

* * * * *